United States Patent [19]

Takagi et al.

[11] Patent Number: 5,361,695
[45] Date of Patent: Nov. 8, 1994

[54] SCREEN PRINTING PLATE FOR LIMITING THE SPREAD OF INK ON AN OBJECT

[75] Inventors: Syunsuke Takagi; Kohzoh Kuroda; Jiro Ono, all of Kyoto, Japan

[73] Assignee: Danippon Screen Mfg. Co., Ltd., Japan

[21] Appl. No.: 910,767

[22] Filed: Jul. 8, 1992

[30] Foreign Application Priority Data

Jul. 8, 1991 [JP] Japan .................. 3-195823
May 30, 1992 [JP] Japan .................. 4-163594

[51] Int. Cl.⁵ .................. B41N 1/24; B41C 1/14
[52] U.S. Cl. .................. 101/127; 101/128.4; 101/129
[58] Field of Search .......... 101/127, 128.21, 128.4, 101/129; 118/406; 427/143

[56] References Cited

U.S. PATENT DOCUMENTS

| | | | |
|---|---|---|---|
| 3,202,094 | 8/1965 | Smallman | 101/127 |
| 4,033,831 | 7/1977 | Bakewell | 101/128.4 |
| 4,135,020 | 1/1979 | Maxwell | 101/127 |

FOREIGN PATENT DOCUMENTS

| | | | |
|---|---|---|---|
| 1960723 | 6/1971 | Germany | 101/128.21 |
| 3331377 | 3/1985 | Germany | 101/127 |
| 22053 | 2/1982 | Japan | 101/128.21 |
| 94753 | 6/1982 | Japan | 101/127 |
| 102797 | 6/1983 | Japan | 101/127 |
| 144396 | 6/1986 | Japan | 101/128.21 |
| 303737 | 12/1988 | Japan | 101/127 |
| 859048 | 1/1961 | United Kingdom | 101/127 |

*Primary Examiner*—Edgar S. Burr
*Assistant Examiner*—Stephen R. Funk
*Attorney, Agent, or Firm*—Ostrolenk, Faber, Gerb & Soffen

[57] ABSTRACT

A printing plate for screen printing to form a prescribed pattern with ink on an object includes: a plate of a prescribed material having a first surface and a second surface and divided at a distribution in accordance with the prescribed pattern into a first part and a second part. The first part has small apertures allowing the ink to be pressed out from the first surface to the second surface formed therein. The second part does not allow the ink to be transferred from the first surface to the second surface. The printing plate further includes a thin partition formed along the boundary of the first part and the second part and protruding by a prescribed uniform height from the second surface. The thin partition is for limiting within the second part the spreading of the ink on an object which is pressed out through the small apertures to the second surface of the second part. A process of manufacturing such a printing plate is also disclosed.

17 Claims, 41 Drawing Sheets

×100

× 100

× 200 x 400 x 800

× 100

× 100

× 200

20 μm□

30 μm²

SCREEN PRINTING PLATE FOR LIMITING THE SPREAD OF INK ON AN OBJECT

BACKGROUND OF THE INVENTION

1. Field of the Invention

The present invention relates generally to screen printing plates for forming a thin film having a prescribed pattern by transferring ink onto an object surface to be printed such as a semiconductor substrate and a glass substrate, and more specifically, to a screen printing plate for use in producing a very small pattern necessary to manufacture a printed circuit board, a semiconductor device, a display device, etc.

2. Description of the Related Art

Screen printing techniques are indispensable for manufacturing state of the art electronic parts such as a semiconductor device, and a flat display panel. In screen printing, a screen printing plate is used on which figures and patterns formed of opening portions and non-opening portions are formed mainly by means of photomechanical process. Ink is placed on the top surface of a screen printing plate. A squeegee is caused to slide across and press downward against the top surface of the screen on which the ink is placed, and in so doing presses ink onto the bottom surface of the screen through the opening portion of a pattern formed on the screen, and further transfer the ink onto the top surface of a material to be printed. Thus, a figure in accordance with the pattern formed on the screen is formed with the ink on the top surface of the material to be printed.

A screen printing plate used in screen printing includes a metal mask plate, a suspended metal plate, etc. These plates are manufactured by forming a figure and a pattern on a screen in a mesh form with an emulsifier, or by etching a thin metal (typically stainless) steel plate. Very thin lines for manufacturing electric parts, etc. are printed using a screen printing plate, with a so-called thin film printing technique. This is because such very thin lines can hardly be formed by means of so-called thick film printing techniques.

FIG. 1 is an enlarged perspective view showing a part of a general structure of the metal mask of a conventional screen printing plate. FIG. 1 is partially cut away for the purpose of illustration. Referring to FIG. 1, the metal mask 300 of the conventional screen printing plate includes a metal plate 301 having an opening area 306, and a non-opening area 307 formed in accordance with a pattern to be printed.

A number of openings 302 are formed in metal plate 301 at the positions of opening area 306.

At the time of printing, ink is placed over the top surface of metal mask 300. A squeegee is pressed downward and slid on the top surface of metal mask 300, and the ink 304 is pressed out to the bottom surface of metal plate 301 through openings 302, as shown in FIG. 2, to be transferred onto the top surface of a material to be printed 303 (for example a glass plate) and form a thin film.

When the thin film printing is conducted using a screen printing plate shown in FIGS. 1 and 2, however, the ink 304 squeezed out onto the bottom surface of openings 302 spreads over the top surface of glass plate 303. Referring to FIG. 2, it is usual for the ink 304 to spread from the edge of opening 302 for as far as about 50 μm. A similar degree of spreading is observed both in the case of a metal mask and in the case of a mesh screen. Furthermore, the degree of spreading changes from position to position, and is never the same. With such spreading, clear printing can not be achieved because the edge of the ink of the thin film takes a wave-like form. Therefore, the very sophisticated printing necessary in a course of manufacturing printed wiring, a semiconductor device, a display device, etc. cannot accurately be obtained by using this conventional screen printing plate.

As a solution to this problem, one screen printing plate is disclosed in Japanese Patent Laying-Open No. 64-87249 and appears at FIGS. 3 and 4 herein as screen printing plate 310 that includes a metal plate 317 having a number of openings 320 formed therein. Metal plate 317 is formed of nickel or the like. As shown in FIG. 3, a cross section 324 of the end of opening 320 takes a curved shape in the vicinity of the top surface of metal plate 317, and a straight line shape in the vicinity of the bottom surface. The periphery of opening 320 in the bottom surface of metal plate 317 is slightly higher (by about 0.5 μm) than the bottom surface of metal plate 317, and its surface is flat. As a result, the edge of opening 320 toward the bottom surface of metal plate is sharpened. It is intended that this sharpened edge accurately form the end of ink to be printed.

Screen printing plate 310 shown in FIGS. 3 and 4 is manufactured as follows: Referring to FIG. 5A, a chromium coated substrate 313 is formed by evaporating a chromium film 312 on one surface of glass substrate 311 of a flat plate shape.

Referring to FIG. 5B, a number of openings 314 are formed in chromium coated substrate 313 in accordance with a prescribed rectangular pattern as shown in FIG. 5C by means of photolithography.

Chromium coated substrate 313 as shown in FIG. 5B is immersed in an Ni salt solution, for example, a luster nickel plating liquid, and a nickel film 316 is formed on chromium film 312 by electrolysis as shown in FIG. 5D. At that time, nickel does not precipitate in that portion in which glass substrate 311 is exposed except for the portion in contact with peripheral chromium film 312, and a part having no nickel film being formed thereon remains in this portion.

Referring to FIG. 5E, finally nickel film 316 is peeled off from chromium coated substrate 313. Thus, a screen printing plate having a number of openings is provided. At that time, there exists around each of the openings a part of nickel film formed directly in contact with glass substrate 311. The bottom surface of this part having grown in direct contact with the surface of the glass plate extends downwardly by the amount of the thickness of chromium film 312 from the bottom surface of nickel film 316 in the other parts. The thickness is about 0.5 μm. The bottom surface of this part is kept from growing by the surface of glass substrate 311 and is flat. More specifically, the raised portion in the circumference of the opening is unavoidably formed by employing the manufacturing method shown in FIGS. 5A-5E.

Other problems yet to be solved are still encountered with the screen printing plate disclosed in Japanese Patent Laying-Open No. 64-87249. A first problem is that the technique disclosed in Japanese Patent Laying-Open No. 64-87249 still leaves room for improvements in the precision of printing results. For example, the applicant manufactured a screen printing plate as disclosed in Japanese Patent Laying-Open No. 64-87249 and printed a material having a dimension of 120 mm at one side, and the result revealed that an error of the end checked by the applicant was more than ±50 μm. A second problem is that the technique disclosed in Japanese Patent Laying-Open No. 64-87249 does not allow printing of a long line. This is because nickel film 316 which is the body of screen printing plate is thin, and the strength of the screen printing plate is not enough to form a long opening for printing a long line. A third problem is that the thick film printing can not be conducted using the screen printing plate disclosed in Japanese Patent Laying-Open No. 64-87249. This is because nickel film 316 is formed by electrolysis, and, therefore, nickel film 316 can not be formed thicker than a certain degree.

SUMMARY OF THE INVENTION

It is therefore an object of the present invention to provide a screen printing plate that permits printing with higher precision, and a method of manufacturing such plate.

Another object of the present invention is to provide a screen printing plate of which precision and a higher printing strength, and a method for manufacturing such plate.

Yet another object of the present invention is to provide a screen printing plate of high precision and higher printing strength, and is usable for both thin film printing and thick film printing.

A printing plate for screen printing in accordance with the present invention is used to form a prescribed pattern on an object utilizing a liquid for pattern formation. The printing plate has a first surface and a second surface, and includes a plate of a prescribed material divided into a first part in which there are very small apertures that permit a liquid for pattern formation to be pressed out from the first surface to the second surface, and a second part that prevents the liquid for pattern formation from moving from the first surface to the second surface, and a limiting member formed along the boundary between the first part and the second part on the second surface in the second part of the plate and protruding by a prescribed uniform height from the second surface. The limiting member limits the spreading of the liquid used for pattern formation and pressed onto the second surface of the second part through the very small apertures onto the surface of the object within the second part.

The liquid for pattern formation pressed out onto the Second surface from the first surface through the very small apertures is likely to spread over the object, but the spreading is limited to the second part of the printing plate by the limiting means. The liquid for pattern formation will not spread freely on the object, and the edge of the pattern to be printed is sharpened. Furthermore, by utilizing the limiting member, a desired gap is formed between the second surface of the printing plate and the object, and as a result both thick film printing and thin film printing can freely be conducted.

Another aspect of the present invention is related to a process of manufacturing a printed plate for screen printing to form a prescribed pattern on an object with a liquid for patterned formation. A printing plate manufactured in accordance with this process has a first surface and a second surface, and includes a plate of a prescribed metal divided into a first part in which very small apertures that allow the liquid for pattern formation to be pressed out from the first surface to the second surface in a distribution corresponding to the prescribed pattern and a second part that keeps the liquid for pattern formation from moving from the first surface to the second surface, and a limiting member formed along the boundary between the first part and the second part on the second surface in the second part of the plate and protruding by a prescribed uniform height from the second surface. The limiting member limits the liquid for pattern formation that is pressed out onto the second surface of the second part through the substantially small apertures from spreading beyond the second part. This process includes the steps of preparing a support body having a flat conductive main surface for supporting a printing plate to be formed later on the main surface; forming a non-conductive layer to have a prescribed first thickness within the range in coincidence with placement of the very small apertures; after the step of forming the non-conductive layer, forming on the main surface of the support body a layer of the metal material constituting the plate of the printing plate to have a prescribed second thickness smaller than the first thickness; forming on the layer of the metal material, a second non-conductive layer having a prescribed second thickness which exposes the formed metal material layer only at the position where limiting means is disposed, and covers the other parts; forming the limiting means on the metal material layer exposed by the second non-conductive layer by forming a prescribed second metal material layer; and after the step of forming the second metal material layer, peeling off only the metal material layer and the second metal material layer from the main surface of the support body.

A printing plate produced by the process described above has the same structure as the printing plate described above and can provide the previously already discussed effects.

According to another aspect of the present invention, a process of forming a printing plate includes the steps of: preparing a support body having a recessed portion formed to receive the limiting member of the printing plate and having a flat conductive main surface in other parts for supporting a printing plate to be formed thereon at a later time; forming a non-conductive layer having a prescribed first thickness within the range in coincidence with placement of very small apertures on the main surface of the support body; after the step of forming the non-conductive layer, forming on the main surface of the support body a layer of the metal material constituting the plate of the printing plate to have a prescribed second thickness smaller than the first thickness; and after the step of forming the layer of the metal material, peeling off only the layer of the metal material from the main surface of the support body.

The printing plate previously described herein can also be manufactured in accordance with this process.

According to yet another aspect of the present invention, a process of manufacturing a printing plate for screen printing includes the steps of: preparing a plate of a prescribed metal having a flat first surface and a flat second surface; forming substantially small apertures at predetermined positions of the plate of the prescribed metal; and forming a limiting member at a prescribed position on the second surface of the prescribed metal plate.

The printing plate previously described herein can also be manufactured by this process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
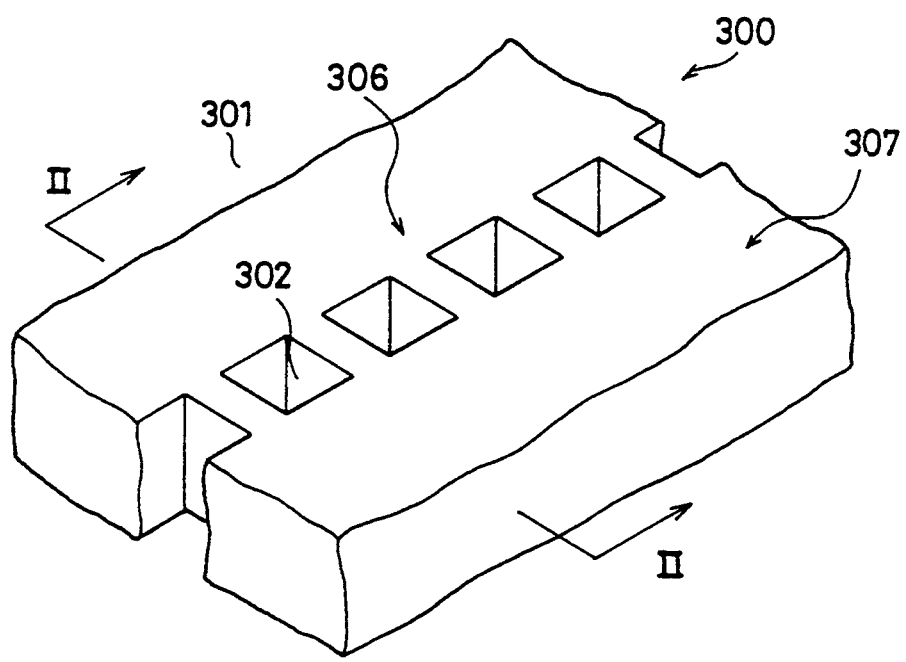
FIG. 1 is an enlarged and partially cutaway perspective view showing a screen printing plate in accordance with a conventional technique.
Figure 2:
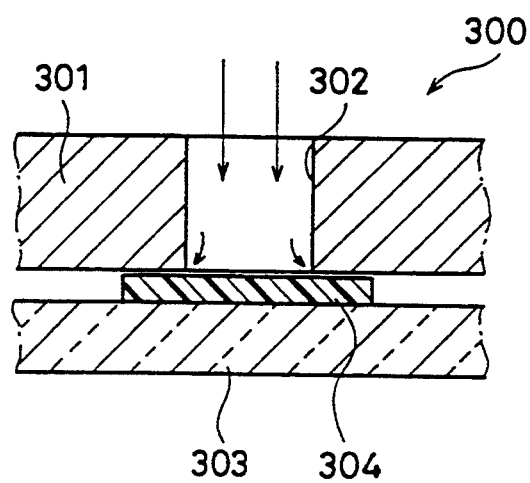
FIG. 2 is an enlarged cross section of part of a screen printing plate useful for illustrating problems associated with the screen printing plate shown in FIG. 1.
Figure 3:
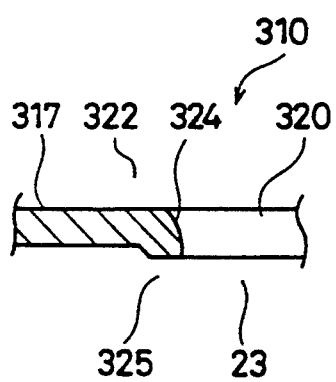
FIG. 3 is an enlarged cross section of part of the screen printing plate disclosed in Japanese Patent Laying-Open No. 64-87249.
Figure 4:
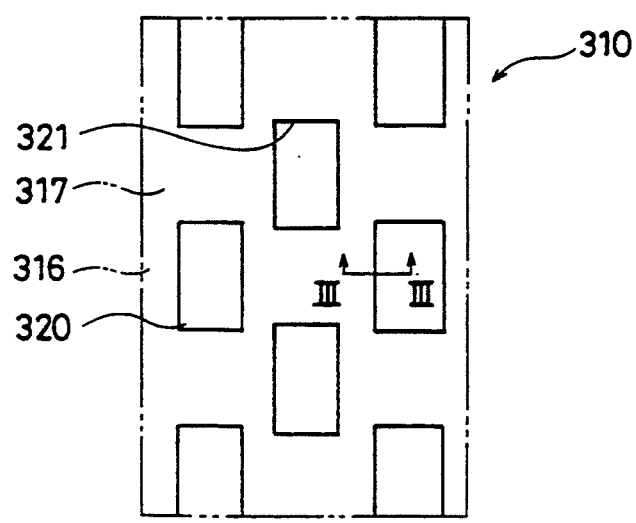
FIG. 4 is an enlarged plan view showing a part of the screen printing plate disclosed in Japanese Patent Laying-Open No. 64-87249.
Figure 5A:
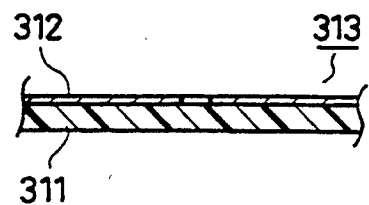
FIGS. 5A-5E are enlarged cross sections for use in describing a manufacturing process for the screen printing plate disclosed in Japanese Patent Laying-Open No. 64-87249.
Figure 5B:
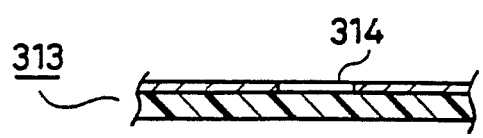
Figure 5C:
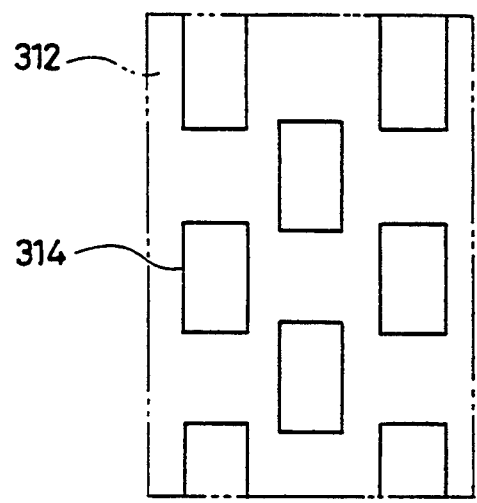
Figure 5D:
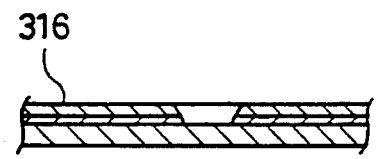
Figure 5E:
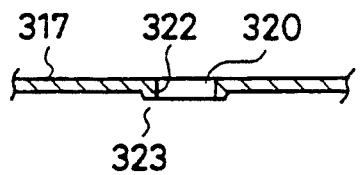
Figure 6:
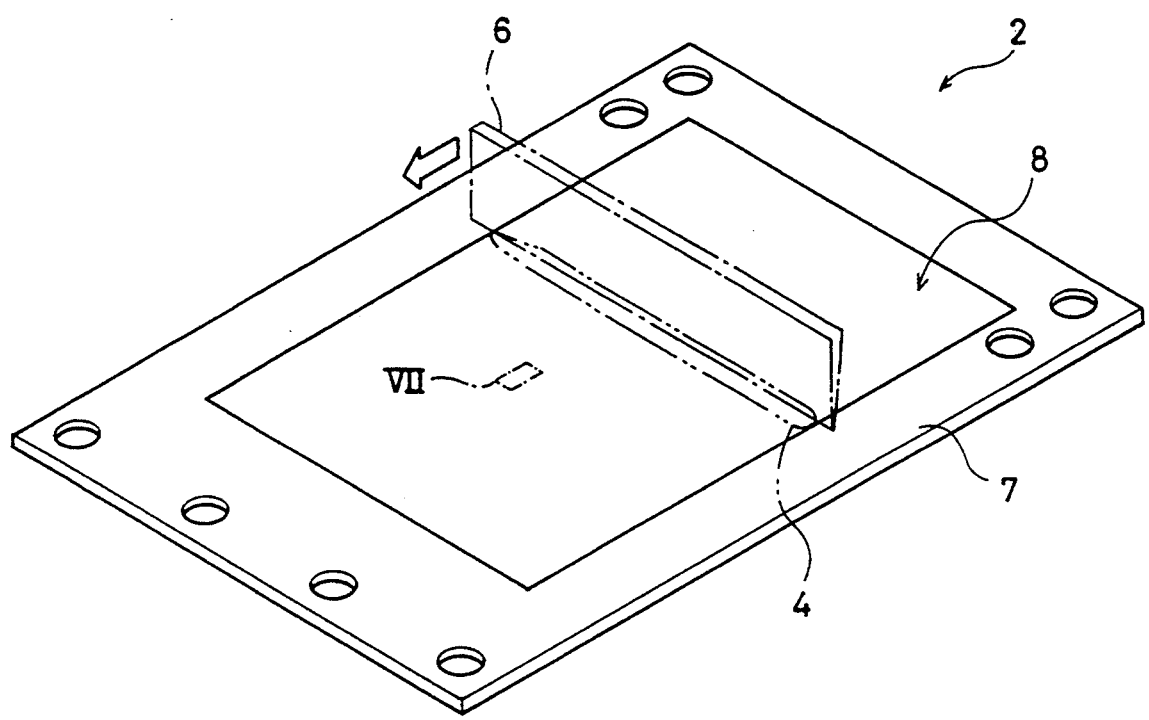
FIG. 6 is an overview perspective illustration of a first embodiment of a screen printing plate constructed in accordance with the present invention.

Referring to FIG. 6, a screen printing plate 2 constructed in accordance with the first embodiment of the present invention includes a frame 7 having a rectangular opening in its center, and a metal mask 8 bridging the opening of frame 7 and having its four sides fixed to frame 7. Metal mask 8 includes an opening area having a number of openings formed therein in accordance with a pattern to be printed, and a non-opening area without any openings. Ink 4 is placed over metal mask 8, squeegee 6 is slid in the direction indicated by the arrow, pressing metal mask 8, and the ink 4 is thus pressed out onto the bottom surface of metal mask 8 through the openings formed in metal mask 8, to be transferred onto the surface of an object placed under screen printing plate 2.

Figure 7:
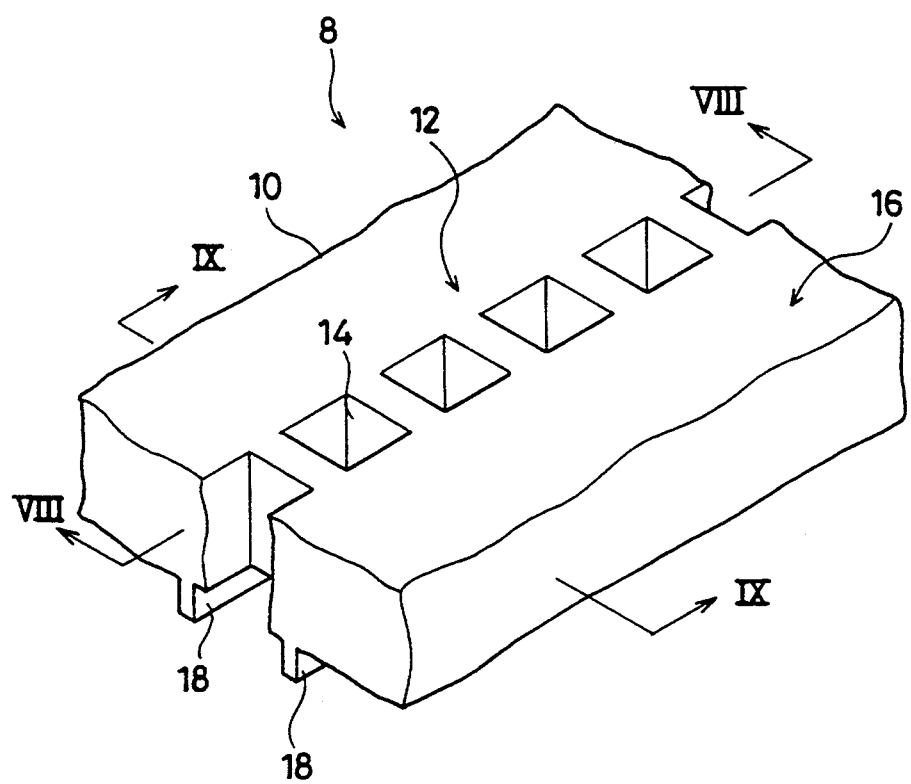
FIG. 7 is a partially cut away and enlarged perspective view showing the screen printing plate in FIG. 6 with portion VII thereof enlarged.
Figure 8:
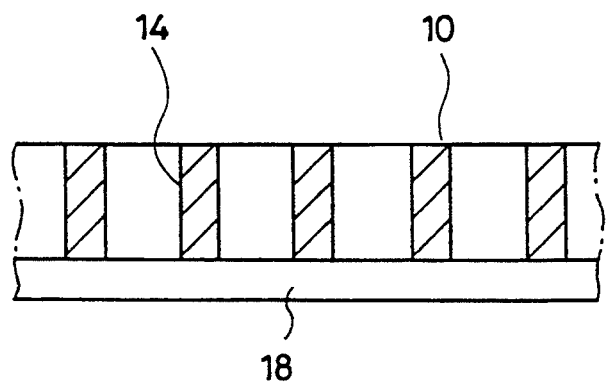
FIG. 8 is a partial cross sectional view taken along VIII—VIII shown in FIG. 7.

Referring to FIG. 7, metal mask 8 includes a metal plate 10 with an opening area 12 having a number of very small apertures 14 formed therein, and a non-opening area 16 without apertures so as to prevent the ink from being pressed out onto the bottom surface. A thin partition 18 is formed surrounding opening area 12 along the end of opening area 12 (see FIG. 8). Thin partition 18 protrudes by a fixed height from the bottom of metal plate 10 in the direction perpendicular to the bottom surface of metal plate 10. The width of thin partition 18 is, for example, not more than 50 μm, and preferably as close as practical to zero. The height of thin partition 18 is, for example, not less than 1 μm and most preferably in the range from 3 μm to 200 μm.

Figure 9:
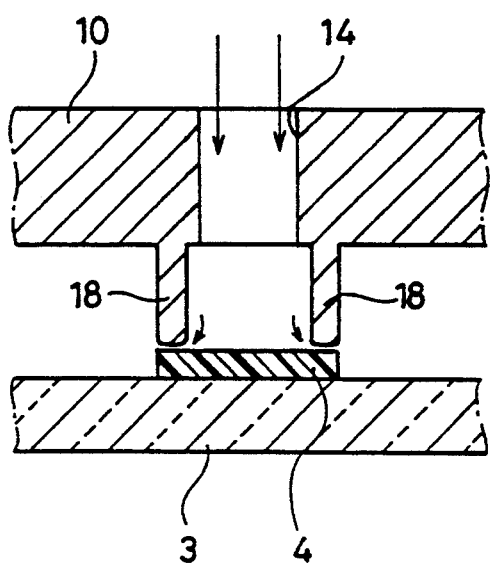
FIG. 9 is a partial cross sectional view taken along IX—IX shown in FIG. 7.

A description of printing using the screen printing plate in accordance with the first embodiment follows particularly in conjunction with FIG. 9. Sliding squeegee 6 (see FIG. 6) causes the ink 4 to be pressed out onto the bottom surface of metal plate 10 through the very small apertures 14 of metal plate 10. The ink 4 is then transferred onto the surface of plate 3 constructed of, for example, glass and forms a thin film thereon. At that time, the ink 4 on glass plate 3 is kept from spreading over glass plate 3 by thin partition 18. The ink 4 spreads to the utmost to the outer edge portion of thin partition 18 and will not spread further therefrom. As a result, the spreading of the ink 4 on glass plate 3 can be restrained within the range between about 20 and 30 μm. Under optimum conditions, this spreading can be restrained within about 10 μm.

Also the spreading of the ink 4 on glass plate 3 is stopped by thin partition 18 protruding from the bottom surface of metal plate 10. Thin partition 18 can be formed approximately in a prescribed shape and size in accordance with a process which will later be described. With the spreading of the ink 4 being restricted by the outer edge of thin partition 18, the end portion of the ink 4 substantially coincides with the shape of the outer edge of thin partition. As a result, the edges of a drawn line, for example, transferred onto glass plate 3 becomes clearer.

Figure 10A:
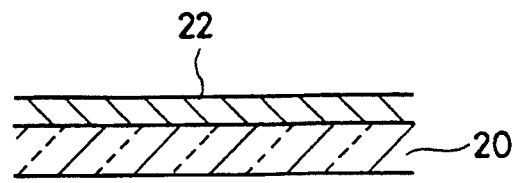
FIGS. 10A-10F are enlarged partial cross sectional views of a metal mask and other structure for use in describing a manufacturing process for the screen printing plate shown in FIGS. 7-9.

A description of a process of manufacturing the screen printing plate in accordance with the first embodiment follows with reference to FIGS. 10A–10F. Referring to FIG. 10A, an indium tin oxide (ITO) film 22 is formed on the surface of a glass plate 20. As is well known, such an ITO film is conductive. A conductive glass plate is prepared by the step of FIG. 10A. The conductive glass plate is used because in a subsequent step of forming a nickel layer by nickel plating, a plate supporting the nickel layer formed must be conductive. As far as being conductive, a stainless steel plate, a copper plate, a yellow copper plate, a plate of nickel plated copper, an iron plate, a nickel plate, etc. may be used instead of the conductive glass plate 20. However, if the support body used is formed by forming ITO film 22 on glass plate 20 as shown in FIG. 10A, a higher precision can be provided, and more sophisticated working can be accomplished as compared to the case where a metal plate is used. It is desirable to subject the surface of glass plate 20 to processings, such as surface grinding, prior to applying film 32.

Figure 10B:
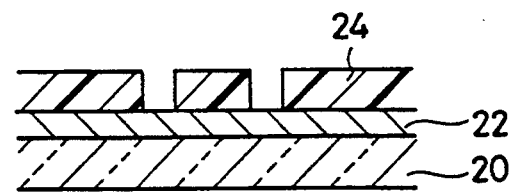

Referring to FIG. 10B, a resist film 24 is formed on the surface of the conductive glass plate formed of glass plate 20 and ITO film 22. The resist film 24 exposes a part of the surface of ITO film 22 in which thin partition 18 (see FIG. 7) is to be formed. Resist film 24 is formed by a process including a known technique, in other words, steps of applying a photoresist liquid, drying the photoresist liquid, cooling (on standing), forming a pattern by close-contact exposure, developing the photoresist film, washing the conductive glass plate with water and drying the same. The exposure pattern used at that time is a pattern selected as a plan view of thin partition 18 in accordance with a predetermined design.

Figure 10C:
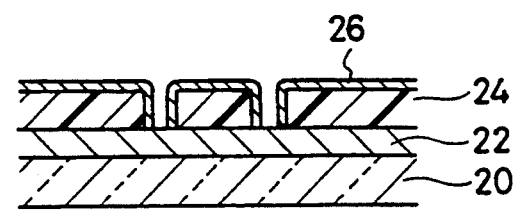

Referring to FIG. 10C, an Ag film 26 is formed covering the entire surface of resist film 24 by means of sputtering (or evaporating) Ag (silver). Thus, the entire surfaces of the conductive glass plate and the resist film 24 are provided with conductivity.

Furthermore, a resist film 28 covering the surface of Ag film 26 in the portion corresponding to very small apertures 14 in the opening area is formed by a process including steps of applying a photoresist liquid onto Ag film 26, drying the photoresist liquid, cooling (on standing) the photoresist liquid, forming a prescribed pattern onto thus formed photoresist layer by close-contact exposure, developing the photoresist layer, and washing with water and drying. More specifically, the pattern used at that time is prepared in advance to indicate the designed plane view of very fine apertures 14.

Figure 10D:
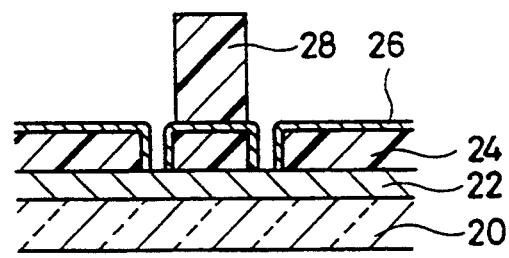
Figure 10E:
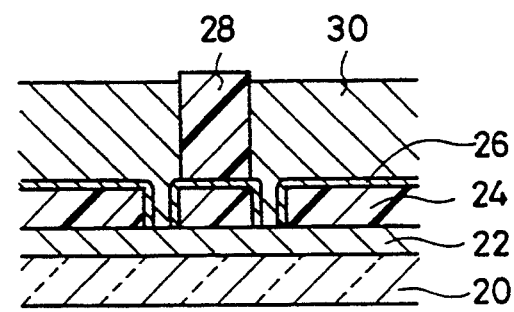

Referring to FIG. 10E, the surface of conductive glass plate having resist films 24 and 28, and Ag film 26 obtained by the steps as far as FIG. 10D is nickel (Ni)-plated, to form a prescribed thickness of Ni layer 30 on Ag film 26, and the conductive glass plate and Ni layer 30 are washed with water.

Finally, resist film 28 is peeled off from the conductive glass plate, Ag film 26 is dissolved and the conductive glass plate is peeled off from Ni layer 30. Thus, a metal plate 10 formed of Ni material having an opening area with a number of apertures 14 and thin partition 18 formed in the circumferential edge of the opening area formed of Ni material is provided. The metal mask of the screen printing plate in accordance with the first embodiment is provided by the above-stated steps.

A specific example of the steps shown in FIGS. 10A–10F is as follows: Referring to FIG. 10B, resist film 24 is formed using AZ4110 (a trade mark of Hoechst JAPAN CO., LTD.). Photoresist liquid is applied on the surfaces of conductive glass plates 20 and 22 as thick as 5.7 µm. The applied photoresist layer is pre-baked for 30 minutes at a temperature of 90° C., and cooled on standing. A mask pattern prepared in accordance with the plan view of thin partition 18 is closely contacted to resist film 24, and the photoresist layer is exposed by the irradiation of a mercury lamp (exposure power: 2 mW/cm$^2$) for 1 minute and forty seconds. Development is conducted by immersing the resist layer and the conductive glass plate into a developing agent at a temperature of 23° C. for 2 minutes and 20 seconds. After the development, the surface of the conductive glass plate is washed with pure water. After the washing, the conductive glass plate and the remaining resist layer 24 are post-baked at a temperature of 140° C. for 30 minutes.

Referring to FIG. 10C, Ag film 26 is formed on the surface of resist layer 24 by means of sputtering by a current of 110 mA, a voltage of 2,800 V for 6 minutes in an argon gas atmosphere, using a D.C. sputtering device.

Referring to FIG. 10D, AZ4620 (a trade mark of Hoechst JAPAN CO., LTD.) is used as a photoresist when resist film 28 having a plan view in accordance with very small apertures is formed. Photoresist liquid is applied onto the surface of the conductive glass plate as thick as 27 µm. The applied photoresist layer is pre-baked at a temperature of 90° C. for 40 minutes, and cooled on standing. Furthermore, a mask pattern prepared in accordance with the forms of very small apertures is registered and closely contacted to the resist film, and is subjected to exposure by the irradiation of the above-stated mercury lamp for 12 minutes. The conductive glass plate having the resist layer formed thereon is then immersed into a developing agent at 23° C. for 6 minutes and 20 seconds, to develop the photoresist layer 24. Thereafter, the surface of the conductive glass plate is washed with pure water, and the conductive glass plate and resist layer 28, etc. on its surface are post-baked at a temperature of 100° C. for 40 minutes.

Referring to FIG. 10E, when Ni layer 30 is formed, a plate to be processed provided by the steps as far as FIG. 10D is immersed into a nickel sulfamic acid bath containing a luster agent, and is subjected to plating process by a current of 10A for 70 minutes.

Figure 10F:
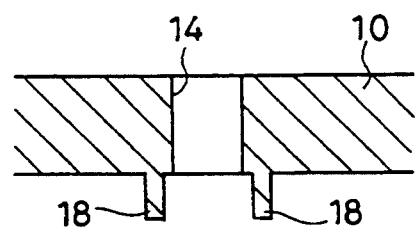

In order to obtain metal plate 10 shown in FIG. 10F, resist film 28 is peeled off from the surface of the conductive glass plate using a 5% NaOH solution. Ag film 26 is dissolved by immersing the plate to be treated into an Ag etching agent formed of a mixture of Cerium (IV) Diammonium Nitrate and perchloric acid for 60 minutes.

By the above-stated steps, a thin partition 18 of screen printing plate is manufactured having a width of 4 µm and a height of 5 µm. The length of very small aperture 14 (the thickness of metal plate 10 formed of Ni) was 25 µm. Furthermore, the applicant has conducted printing using the screen printing plate thus manufactured, and a result was obtained which is better than the result by the technique disclosed in Japanese Patent Laying-Open No. 64-87249, and the precision in its sides was within ±3 µm.

Figure 11:
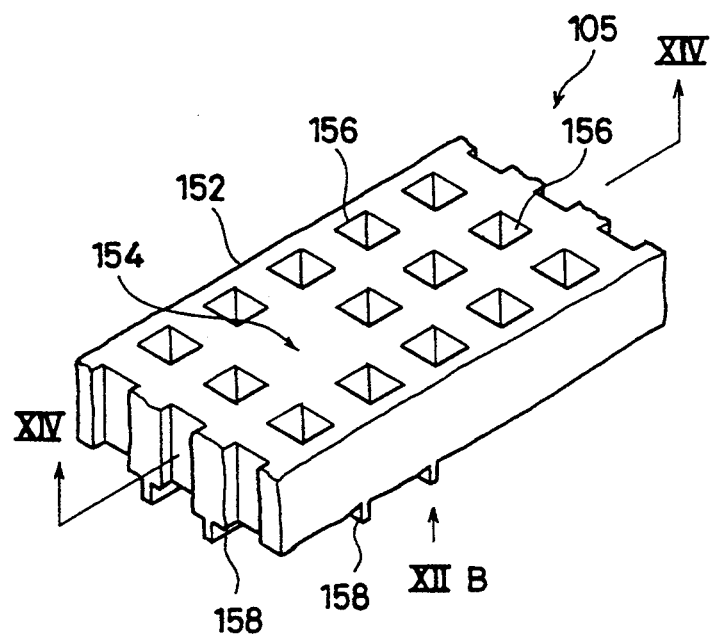
FIG. 11 is an enlarged perspective view showing a part of a second embodiment of a screen printing plate in accordance with the present invention.

The screen printing plate in accordance with the first embodiment described above was for use in forming a black line on a white background. A screen printing plate in accordance with the second embodiment which will be described in the following is for use in printing reversed dots on a black background. Referring to FIG. 11, a metal mask 105 of the screen printing plate in accordance with the second embodiment includes a metal plate 152 having a number of very small apertures 156. The part of metal plate 152 to be printed in a reversed dot is a non-opening region 154 in which very small apertures 156 are not formed. Thin partitions 158 selected to take a shape suitable for reversed dot printing are formed on the bottom surface of metal plate 152. The shape thereof will be later described.

Figure 12A:
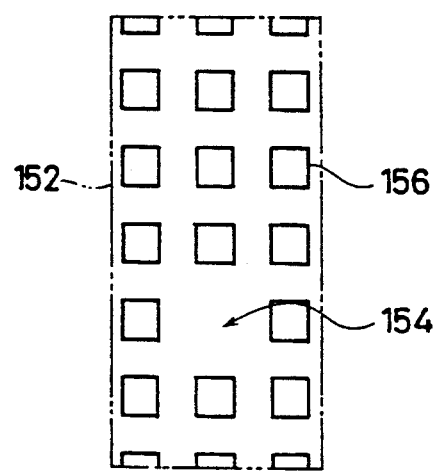
FIG. 12A is a view showing the front surface of the screen printing plate shown in FIG. 11.

Referring to FIG. 12A, although a number of very small apertures 156 are formed in metal plate 152 as described above, a part of the region is non-opening area 154. The provision of the non-opening area 154 aims at printing reversed dots.

Figure 12B:
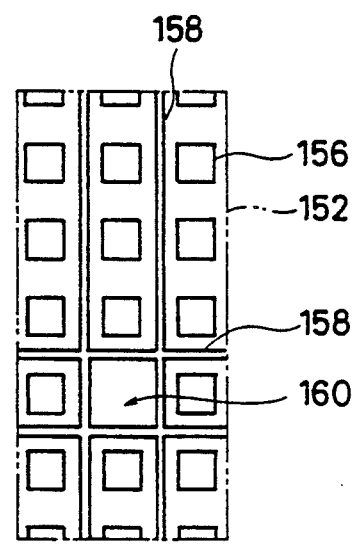
FIG. 12B is a view showing the rear surface of the screen printing plate shown in FIG. 11.

FIG. 12B is a rear view of metal plate 152 showing the metal mask 105 of the screen printing plate shown in FIG. 11, viewed in the direction of the arrow XIIB. Referring to FIG. 12B, the rear part of non-opening area 154 shown in FIG. 12A is a reversed dot printing part 160. On the rear surface of metal plate 152, thin partitions 158 are formed to surround the periphery of reversed dot part 160. Thin partitions 158 form a square defining the surroundings of reversed dot part 160. Thin partitions 158 extend in the directions in which the sides of this square are extended.

Referring specifically to FIG. 12B, printing is conducted using the metal mask 105 of the screen printing plate in accordance with the second embodiment as in the following. Ink is squeezed out from the front surface side to the rear surface side of each very small aperture 156 by a squeegee (not shown). In the area in which no thin partition 158 is provided, the ink spreads over a material to be printed, but in the area in which thin partitions 158 are formed, the ink does not spread further beyond thin partitions 158. Therefore, the ink will never come into reversed dot part 160. Thus, a reversed dot area is formed on the material to be printed at positions corresponding to the reversed dot part 160. At that time, the ink defining the sides of the reversed dot area is restricted by the side end portions of thin partitions 158 on the side of reversed dot part 160. The degree of the ink spreading will not vary from position to position. Therefore, the circumferential ends of the reversed area to be formed on the material to be printed takes a shape of a straight line with very few protrudings and recesses.

Figure 13:
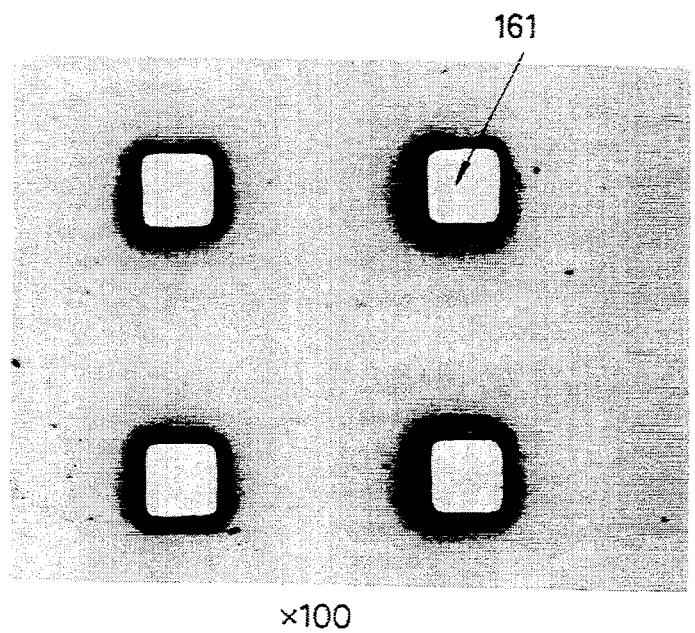
FIG. 13 is a plan view showing a result of printing in accordance with the second embodiment.

FIG. 13 shows a result of printing a reversed dot area 161 in a square having a dimension of 100 μm at one side, using the screen printing plate shown in FIG. 11. As shown in FIG. 13, reversed dot area 161 has a very clear edge.

Figure 14A:
FIGS. 14A-14F are partially enlarged cross sectional views showing a metal mask and other structure, for use in describing a manufacturing process for the screen printing plate in accordance with the second embodiment.

The screen printing plate in accordance with the second embodiment is manufactured by a process as in the following. Referring to FIG. 14A, an ITO film 22 is formed on the surface of a glass plate 20. Glass plate 20 and ITO film 22 form a conductive glass plate. As described above, a metal plate such as a stainless steel plate may be used instead of this conductive glass plate.

Figure 14B:
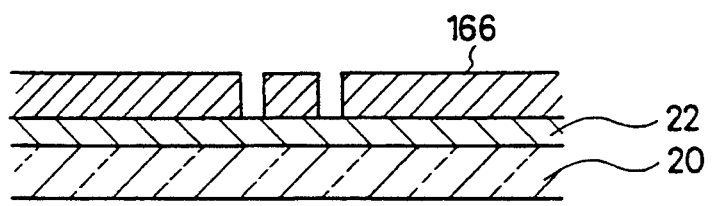

Referring to FIG. 14B, a resist film 166 is formed by a usual process. Resist film 166 exposes the surface of ITO film 22 only in the part corresponding to thin partitions 158 (see FIGS. 11, 12A, and 12B) and resist film 166 covers the other parts of ITO film 22. A process of forming resist film 166 in accordance with a usual technique includes, for example, steps of applying photoresist liquid onto ITO film 22, drying the photoresist liquid, cooling the photoresist layer (for example, on standing), directly drawing a pattern on the resist film by means of an electron beam, developing the resist film, and washing with water and drying the resist film after the development. Instead of the direct drawing by means of the electron beam, the pattern may be closely contacted onto the resist film as described above and the mask pattern may be exposed onto the resist film by light. Also, without conducting such exposure, a prescribed part of the resist layer may be cut out by a laser beam. If the resist film is directly cut using the laser beam, the steps from development to drying will not be necessary. However, after the resist film is cut out by the laser, a part of the resist film sticks to the surface of the resist film and the surface of ITO film 22. Therefore, in such a case, it will be necessary to blow away the remaining resist film using a nitride gas, for example.

Figure 14C:
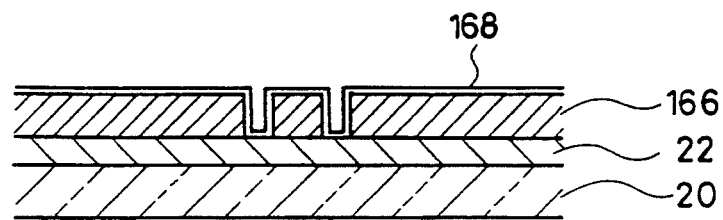

Referring to FIG. 14C, an Ag film 168 is formed to cover the entire surfaces of resist film 166 and exposed ITO film 22 by means of Ag sputtering (or Ag evaporation). Thus, the surface of a plate to be treated formed of glass plate 20, ITO film 22, and resist film 166 is provided with conductivity.

Figure 14D:
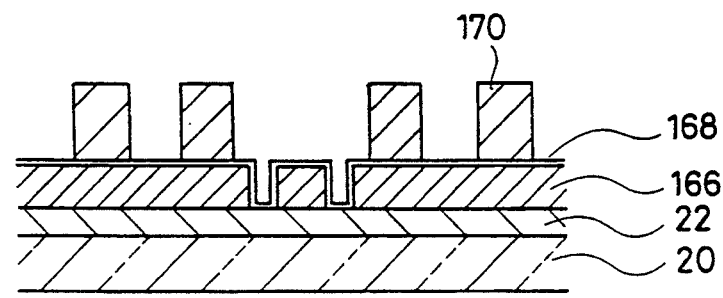

Referring to FIG. 14D, a resist film 170 is formed covering the surface of Ag film 168 at positions corresponding to very small apertures 156 in the opening area (see FIG. 11). A process of forming resist film 170 is the above-stated usual process.

Figure 14E:
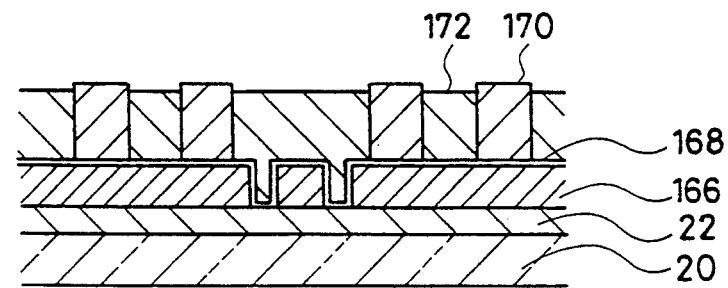

Referring to FIG. 14E, an Ni layer 172 having a prescribed thickness is formed on Ag film 168 by nickel plating. The plate to be treated is then washed with water. Further, raised portions of Ni created in the course of plating are removed by sandpaper, and the plate to be treated is washed with water and dried.

Figure 14F:
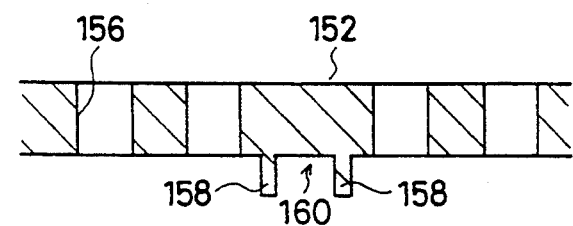

Subsequently, Ni layer 172 shown in FIG. 14E is peeled off from the conductive glass plate (glass plate 20 and ITO film 22), and resist films 170 and 166 are dissolved. Ag film 168 is dissolved and removed away from Ni layer 172, and Ni layer 172 is washed with water and dried. Thus, as shown in FIG. 14F, metal plate 152 of Ni material having an opening area corresponding to a prescribed printing patten and thin partitions 158 integrally formed on the side of the bottom surface is obtained. A plan view of thin partition 158 is shown in FIG. 12B by way of example, but the shape is not necessarily the one shown in FIG. 12B.

By the above-stated process, the metal mask of the screen printing plate for printing reversed dots in accordance with the second embodiment is manufactured.

Figure 15:
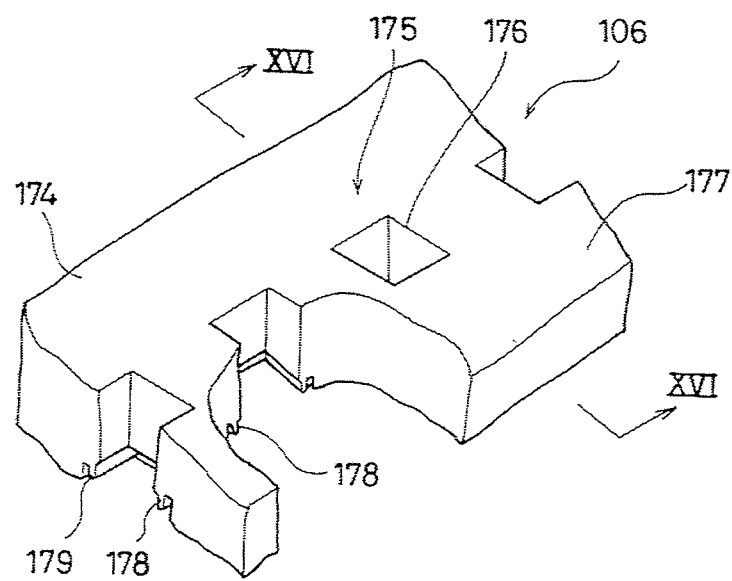
FIG. 15 is an enlarged perspective view showing a part of a third embodiment of a screen printing plate in accordance with the present invention.
Figure 15A:
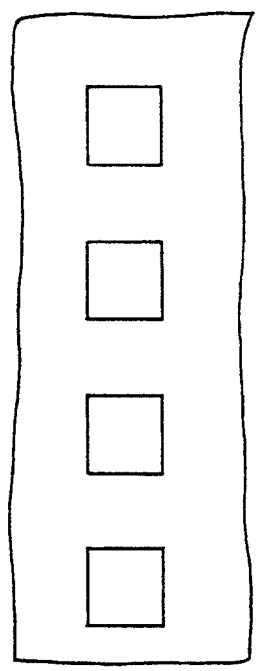
FIG. 15A is a top plan view of FIG. 15.
Figure 15B:
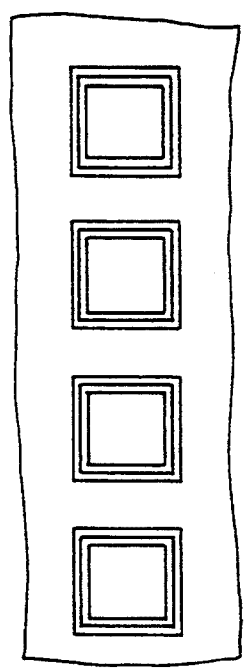
FIG. 15B is a bottom plan view of FIG. 15.

FIG. 15 is an enlarged perspective view showing a part of a screen printing plate in accordance with the third embodiment of the present invention. Referring to FIGS. 15–15B, the metal mask 106 of the screen printing plate includes a metal plate 174 having an opening area 175 and a non-opening area 177. There are formed in opening area 175 a number of square shaped very small apertures 176. A cross section of very small aperture 176 is shown in FIG. 16D.

The screen printing plate in accordance with the third embodiment is for use in thick film printing. On the rear surface of metal plate 174, grooves 179 are formed beside the sides of very small apertures 176 and each surrounds an aperture 176. There is formed a thin partition 178 between each groove 179 and the lower opening of aperture 176. The rear surface of metal plate 174 in non-opening area 177 is flush with the top edge of thin partition 178 except for the part of groove 179.

Also in the case where the screen printing plate in accordance with the third embodiment is used, ink is pressed out through apertures 176 to the side of the bottom surface of metal plate 174 by a squeegee (not shown). The ink is confined into a space defined by thin partitions 178, and likely to spread over the surface of a material to be printed. However, the ink is restricted from spreading by thin partitions 178, and does not spread further outside the outer edge of thin partitions 178. Therefore, the edge of a line can accurately be printed out in the thick film printing, using the screen printing plate in accordance with the third embodiment.

FIGS. 16A–16D are partially cross sectional views showing a metal mask viewed in the direction of line XVI—XVI in FIG. 15, illustrating a process of forming a metal mask of screen printing plate 106 shown in FIG. 15.

Figure 16A:
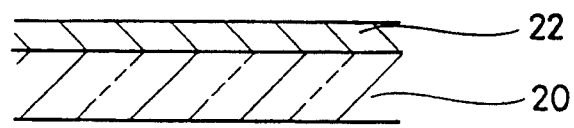
FIGS. 16A-16D are enlarged cross sectional views showing a metal mask and other structure, for use in describing a manufacturing process for the screen printing plate in accordance with the third embodiment.
Figure 16B:
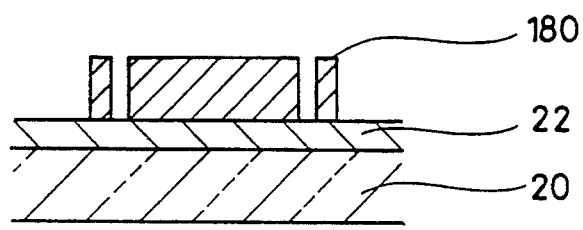

Referring to FIG. 16A, ITO film 22 is formed on the surface of glass plate 20. Then, as shown in FIG. 16B, a resist film 180 in a form corresponding to the shape of recesses of the rear surface of the metal plate 174 of the metal mask 106 of an ultimate screen printing plate is formed on ITO film 22. A process of forming photoresist film 180 is the same as that already described in conjunction with FIG. 10B. Therefore, a detailed description will not be repeated here.

Figure 16C:
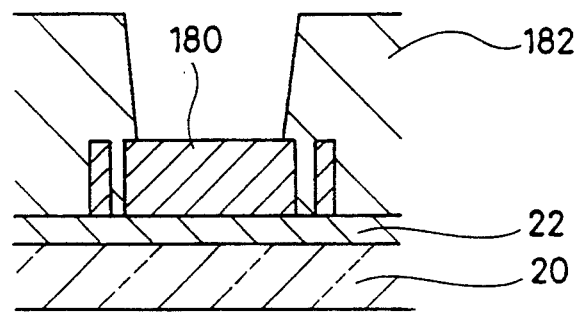
Figure 16D:
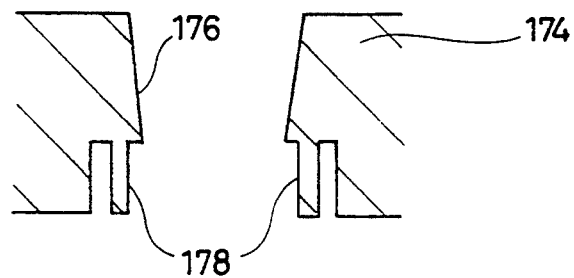

Referring to FIG. 16C, an Ni layer 182 having a prescribed thickness is formed by Ni plating on ITO film 22. In this case, because Ni precipitates only on the conductive surface, Ni layer 182 is not formed on the part corresponding to the apertures in resist film 180. However, as the Ni layer is precipitated in the region adjacent to the part, the Ni layer is grown slightly toward the center in the bottom portion of the part corresponding to the apertures. As a result, the cross sectional area of an aperture is slightly reduced downwardly. After the formation of Ni layer 182, the plate to be treated is washed with water and dried.

Finally, Ni layer 182 is peeled off from the conductive glass plate, resist film 180 is dissolved, and Ni layer 182 is washed with water and dried. Thus, as shown in FIG. 16D, metal plate 174 of an Ni material having apertures 176, and thin partitions 178 integrally formed around apertures 176 can be provided. The metal mask 106 of the screen printing plate in accordance with the third embodiment is thus provided.

Figure 17:
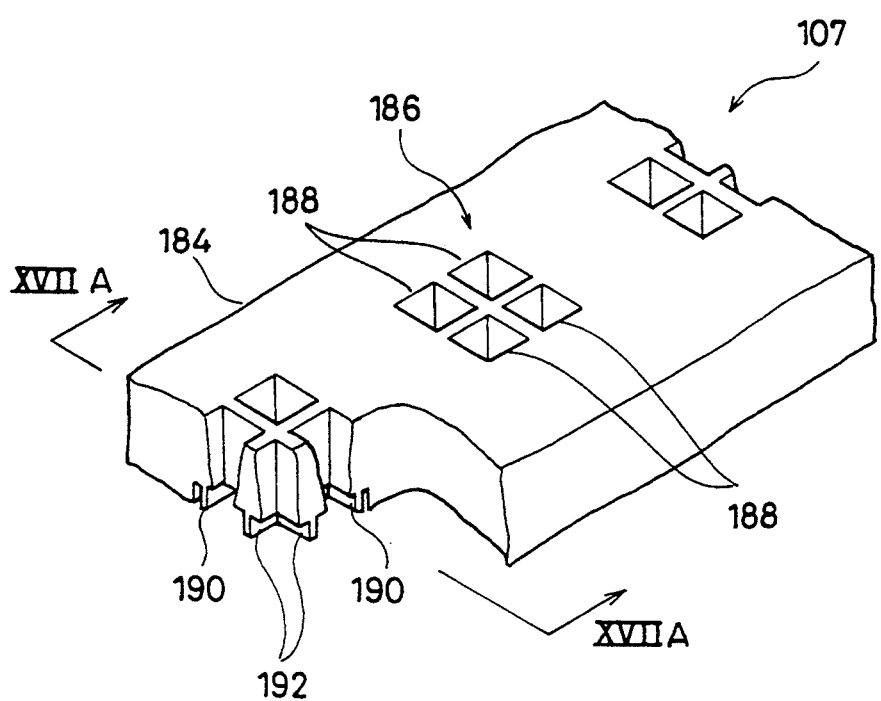
FIG. 17 is an enlarged perspective view showing a part of a fourth embodiment of a screen printing plate in accordance with the present invention.
Figure 17A:
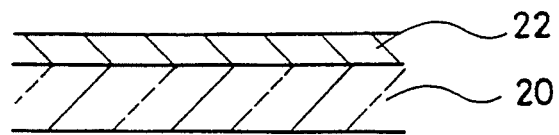
FIGS. 17A-17D are enlarged cross sectional views showing a part of a metal mask and other structure, for use in describing a manufacturing process for the screen printing plate in accordance with the fourth embodiment.
Figure 17B:
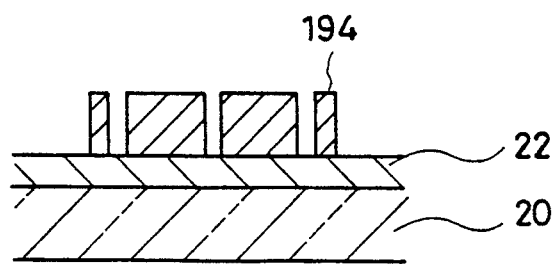

FIG. 17 is an enlarged perspective view showing a part of a metal mask 107 of a screen printing plate in accordance with the fourth embodiment of the present invention. The metal mask 107 of the screen printing plate in accordance with the fourth embodiment is for printing one dot by an aperture group 186 of a plurality of apertures 188.

Referring to FIG. 17, the metal mask 107 of the screen printing plate has a metal plate 184. A plurality of aperture groups 186 are formed in metal plate 184. Each aperture group 186 includes four very small apertures 188 according to the present embodiment. A plan view of each aperture 188 is a square. The four apertures 188 included in each aperture group 186 are placed to form a larger square as a whole and the spaces between apertures 188 are delineated by thin bridges.

Thin partitions 190 are formed around aperture groups 186 to surround the peripheries of apertures 188 on the bottom surface of metal plate 184. Thin partitions 192 are formed on the bottom surfaces of bridges between apertures 188.

In the metal mask 107 of the screen printing plate in accordance with the fourth embodiment, ink is pressed into each very small aperture 188 by a squeegee which is not shown and reaches the surface of a material to be printed. The ink is likely to spread over the surface of the material to be printed from the spaces under apertures 188. However at that time, the ink is restrained from spreading by thin partitions 190, and will not spread further beyond the outer end portions of thin partitions 190. The ink which has reached the spaces below apertures 188 also spreads toward adjacent apertures adjacent to each other with thin partitions 192 therebetween. With the ink thus spreading toward adjacent apertures from the spaces below the apertures, the ink from the adjacent apertures becomes one in the lower portion of thin partitions 192, and a printed dot of one large square is formed by aperture groups 186 as a result. Also in the case of the metal mask 107 of the screen printing plate in accordance with the fourth embodiment, the edge of printed dot is restricted by the outer edge of thin partitions 190 and, therefore, the printed dot has a very clear edge.

FIGS. 17A–17D are cross sectional views taken along the direction of XVIIA—XVIIA shown in FIG. 17, illustrating a process of manufacturing a screen printing plate in accordance with the fourth embodiment.

The process shown in FIGS. 17A–17D is substantially identical to the process shown in FIGS. 16A–16D. However, the patterned shape of a resist layer 194 shown in FIG. 17B, as opposed to that of the resist layer 180 shown in FIG. 16B, takes a shape for forming aperture groups 186 shown in FIG. 17.

Figure 17C:
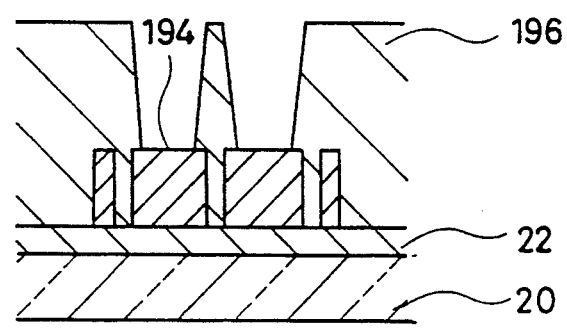
Figure 17D:
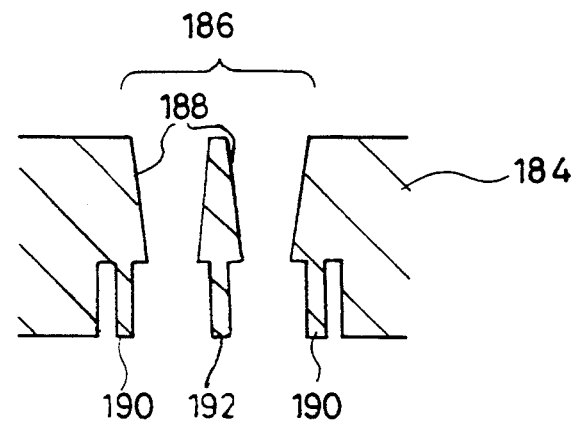

Referring to FIG. 17C, an Ni layer 196 is formed on ITO film 22 by Ni plating. Ni layer 196 is peeled off from glass plate 20 and ITO film 22, resist layer 194 is dissolved, and Ni layer 196 is washed with water and dried, to provide a metal plate 184 having a cross sectional shape as shown in FIG. 17D. Other detailed features are identical to those already described in conjunction with FIGS. 16A–16D and therefore, a detailed description thereof will not be repeated here.

Figure 18:
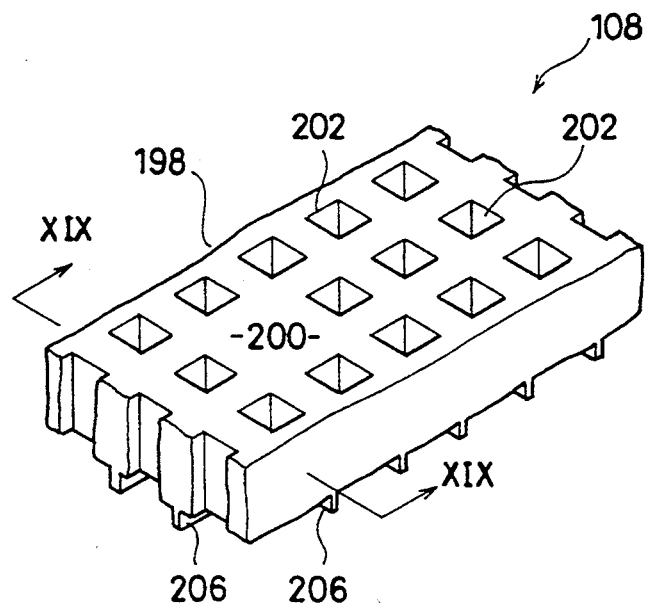
FIG. 18 is an enlarged perspective view showing a part of a fifth embodiment of a screen printing plate in accordance with the present invention.
Figure 18A:
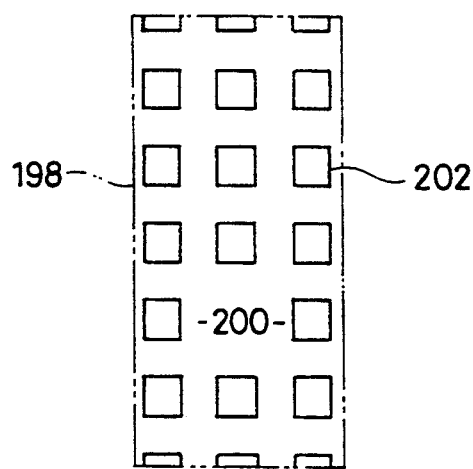
FIG. 18A is a top plan view of FIG. 18.
Figure 18B:
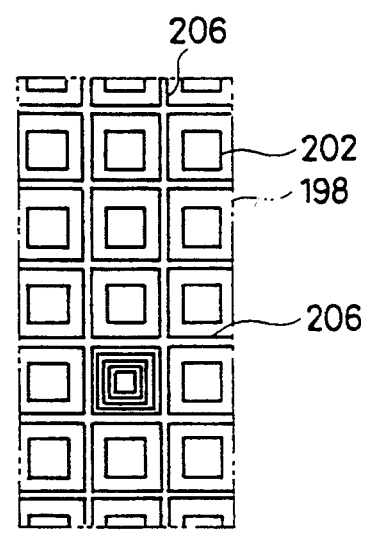
FIG. 18B is a bottom plan view of FIG. 18.

FIG. 18 is a partially cut away and enlarged perspective view showing a metal mask 108 of a screen printing plate in accordance with the fifth embodiment of the present invention. Referring to FIGS. 18–18B, the metal mask 108 of the screen printing plate in accordance with the fifth embodiment includes a metal plate 198, and a number of apertures 202 are formed in metal plate 198. Apertures 202 are arranged in a matrix array except for a region 200. Region 200 is provided for forming a reversed dot.

In the metal mask 108 of the screen printing plate shown in FIG. 18, a number of thin partitions 206 are formed in a lattice between the lower openings of apertures 202 on the bottom surface of metal plate 198. The region 200 is also surrounded by thin partitions 206.

By utilizing the metal mask 108 of the screen printing plate in accordance with the fifth embodiment, a black background is formed by a plurality of apertures 202 and a reversed dot is formed under region 200. The edge of the reversed dot is defined by thin partitions 206 around unapertured aperture region 200 formed on the rear surface of metal plate 198. More specifically, ink pressed into apertures 202 by a squeegee reaches the surface of a material to be printed and is likely to spread over the surface of the material to be printed. However at that time, the ink is restrained by thin partitions 206 from spreading and will not spread beyond the outer edge of thin partitions 206. As is the case with the embodiment shown in FIG. 17, the ink in apertures 202 comes into one under thin partitions 206, where a single partition 206 is between two apertures 202. As a result, one reversed dot having clear peripheral edges is formed by a plurality of apertures surrounding region 200.

FIGS. 19A–19D is a cross sectional view taken along the direction of XIX—XIX of metal plate 198 showing a process of manufacturing the metal mask 108 of the screen printing plate shown in FIG. 18.

Figure 19A:
FIGS. 19A-19D are enlarged cross sectional views showing a part of a metal mask and other structure, for use in describing a manufacturing process for the screen printing plate in accordance with the fifth embodiment.
Figure 19B:
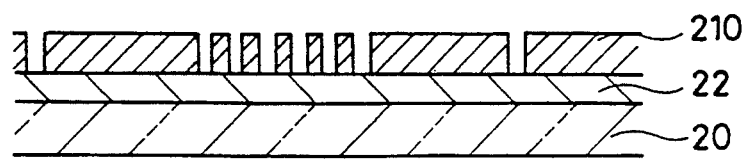

Referring to FIG. 19A, ITO film 22 is formed on glass plate 20. Further referring to FIG. 19B, a resist film 210 patterned to receive the recesses of the rear surface of metal plate 198 is formed on ITO film 22. The formation of resist film 210 is conducted in accordance with a known process.

Figure 19C:
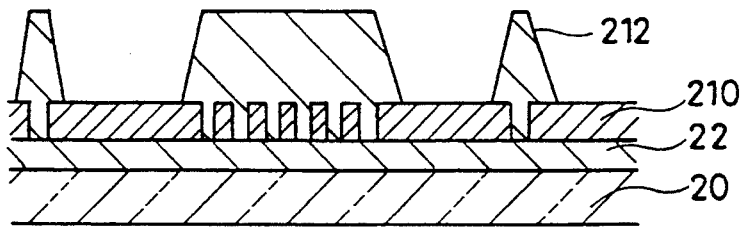
Figure 19D:
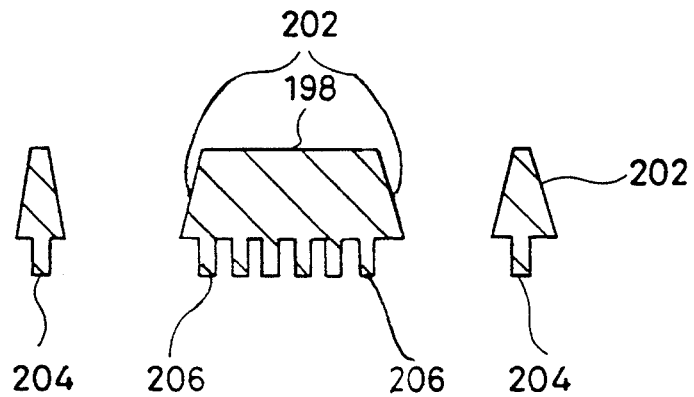

Referring to FIG. 19C, an Ni layer 212 is formed on ITO film 22 by Ni plating. Then, Ni layer 212 is peeled off from glass plate 20 and ITO film 22. Photoresist layer 210 is dissolved, Ni layer 212 is washed with water and dried, and thus metal plate 198 shown in FIG. 19D is provided.

Figure 20:
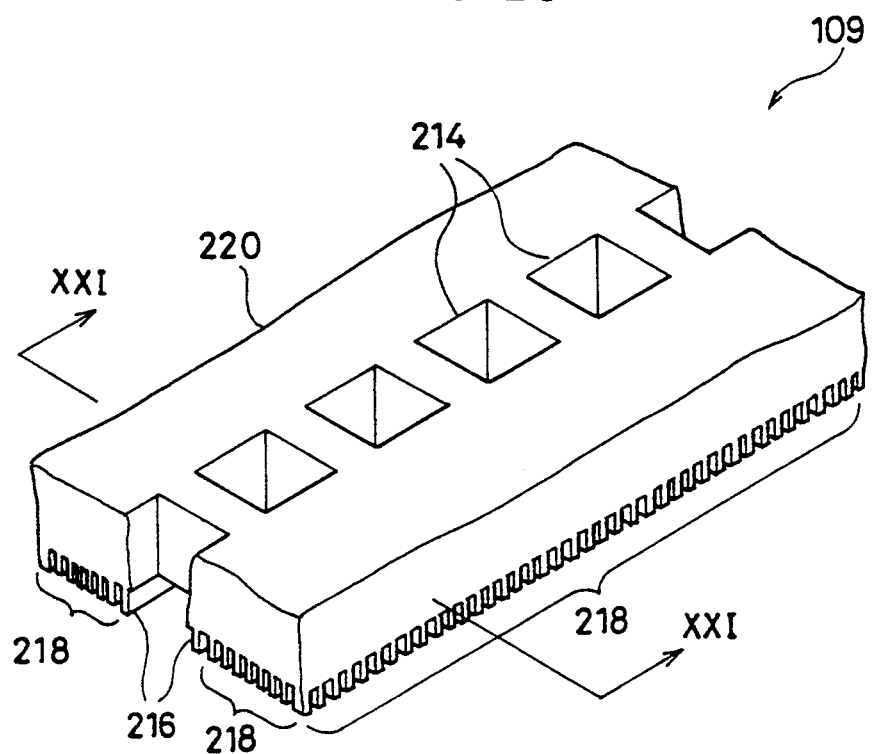
FIG. 20 is an enlarged perspective view showing a part of a sixth embodiment of a screen printing plate in accordance with the present invention.
Figure 20A:
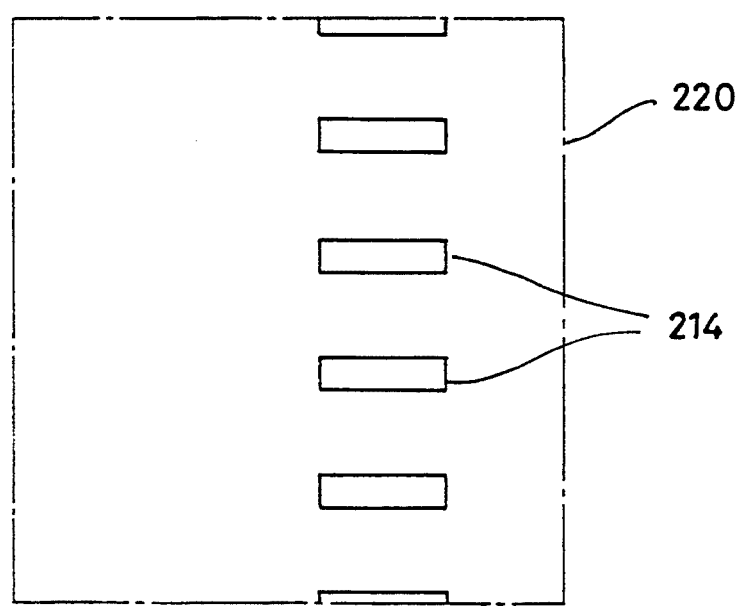
FIG. 20A is a top plan view of FIG. 20.
Figure 20B:
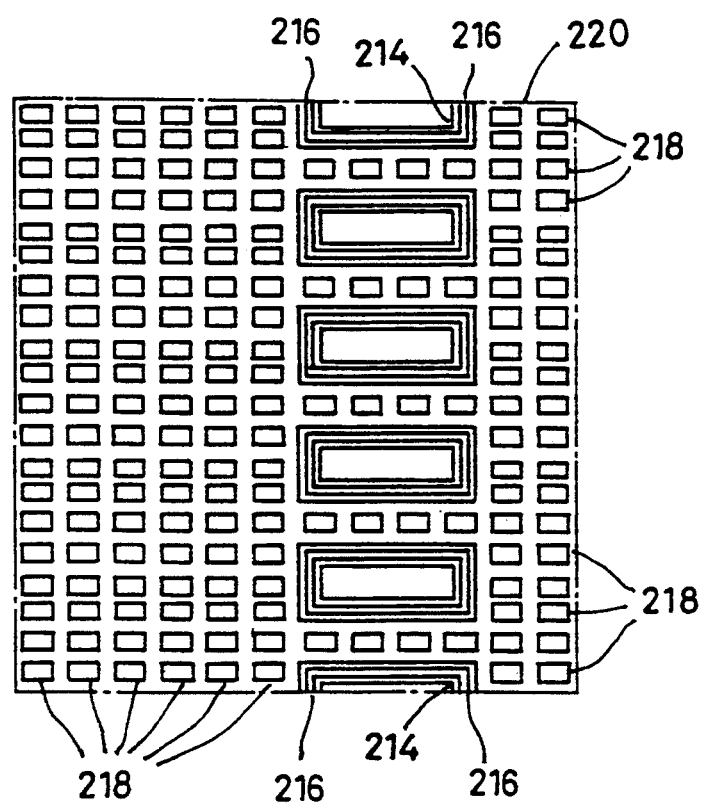
FIG. 20B is a bottom plan view of FIG. 20.

FIG. 20 is an enlarged perspective view showing part of a metal mask 109 of a screen printing plate constructed in accordance with the sixth embodiment of the present invention. Referring to FIGS. 20–20B, the metal mask 109 of the screen printing plate includes a metal plate 220 having a plurality of apertures 214. On the rear surface of metal plate 220, a number of thin partitions 218 are formed in a lattice. Thin partitions 216 are formed around each of apertures 214.

At the time of printing, ink is pressed into apertures 214 by a squeegee which is not shown, and the ink reaches the surface of a material to be printed. The ink is likely to spread over the surface of the material to be printed from the spaces under apertures 214. However, thin partitions 216 restricts the ink from spreading, and the ink will not spread further beyond the outer edge of thin partitions 216. As a result, a plurality of dots corresponding to apertures 214 are printed by this screen printing plate 109.

In the sixth embodiment, a number of thin partitions 218 are formed on the rear surface of metal plate 220. With these thin partitions being formed, the strength of the metal mask is increased as compared to otherwise, and thus excellent printing operations can be conducted for a much longer period of time.

Figure 21A:
FIGS. 21A-21D are enlarged cross sectional views showing a part of a metal mask and other structure, for use in describing a manufacturing process for a screen printing plate in accordance with the sixth embodiment.
Figure 21B:
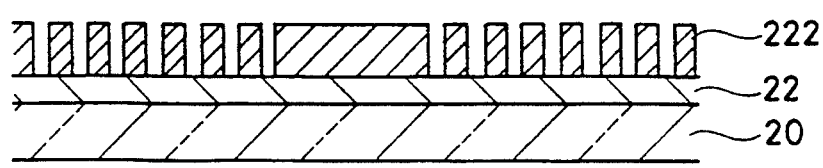

FIGS. 21A–21D are enlarged cross sectional views taken along the direction of line XXI—XXI shown in FIG. 20, used for illustrating the steps in a process of manufacturing the metal mask 109 of the screen printing plate shown in FIG. 20. Referring to FIG. 21A, ITO film 22 is formed on glass plate 20. Then, referring to FIG. 21B, a resist film 222 having a pattern for receiving the recesses on the rear surface of metal plate 220 is formed on ITO film 22. A method of forming resist film 222 is identical to the one already discussed and therefore, a detailed description thereof will not be repeated here.

Figure 21C:
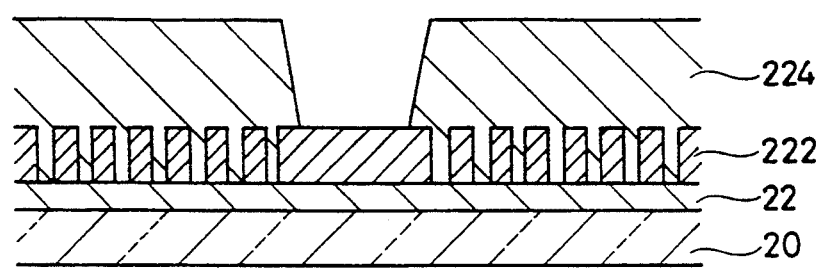
Figure 21D:
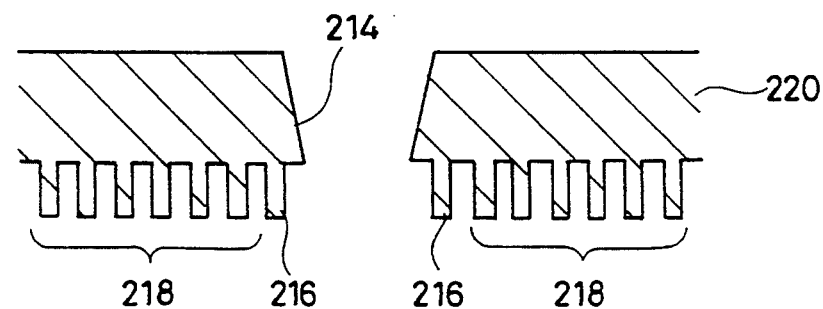

Referring to FIG. 21C, an Ni layer 224 having a prescribed thickness is formed on ITO film 22 by Ni plating. Ni layer 224 is peeled off from glass plate 20 and ITO film 22. Resist layer 222 is dissolved and removed away from Ni layer 224, and Ni layer 224 is washed with water and dried, thus providing a metal mask of a screen printing plate formed of metal plate 220 as shown in FIG. 21D. As shown in FIG. 21D, thin partitions 216 are formed around apertures 214, and a number of thin partitions 218 are formed in a lattice in an outer non-opening area.

Figure 22:
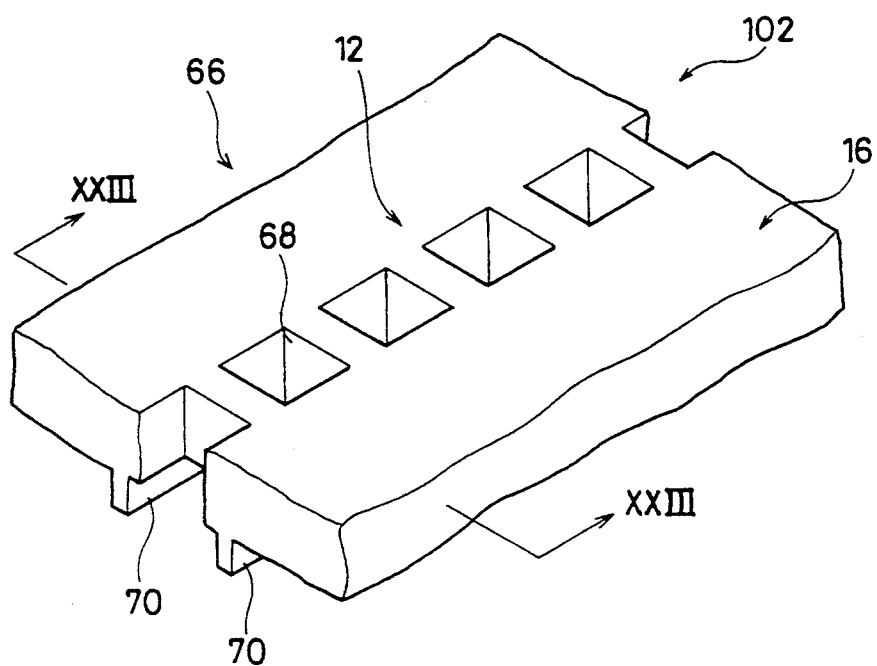
FIG. 22 is a partially enlarged perspective view showing a part of a seventh embodiment of a screen printing plate in accordance with the present invention.

FIG. 22 is an enlarged perspective view showing a part of a metal mask 102 of a screen printing plate in accordance with the seventh embodiment of the present invention. The metal mask 102 of the screen printing plate has a substantially identical form to that of the metal mask 8 of the screen printing plate in accordance with the first embodiment shown in FIG. 7, but a method of manufacturing thereof is different.

Referring to FIG. 22, the metal mask 102 of the screen printing plate includes a metal plate 66 having a surface divided into an opening area 12 and a non-opening area 16. In opening area 12, a number of very small apertures 68 are formed. Thin partitions 70 are formed to surround opening area 12 at the circumferential periphery of opening area 12 on the rear surface of metal plate 66. The height of thin partitions 70 from the rear surface of metal plate 66 is fixed. The bottom surface of thin partition 70 is substantially flat. The width of thin partition 70 is preferably as small as possible.

Printing using the metal mask 102 of the screen printing plate in accordance with the seventh embodiment is conducted as is the case with the first embodiment. That is, ink is pressed into small apertures 68 by a squeegee which is not shown and reaches a material to be printed. The ink is likely to spread over the surface of the material to be printed from the spaces under small apertures 68. However, at that time thin partitions 70 restricts the spreading of the ink. Therefore, the ink will not spread beyond the outer edge of thin partitions 70. As a result, a line corresponding to opening area 12 is formed on the material, with both edges of the line being substantially in coincidence with the positions of the outer edges of thin partitions 70 and the edges of the line are very clear.

FIGS. 23A–23I are partial cross sectional views taken along the direction of XXIII—XXIII shown in FIG. 22, for use in illustration of a process of forming the metal mask 102 of the screen printing plate in accordance with the seventh embodiment.

Figure 23A:
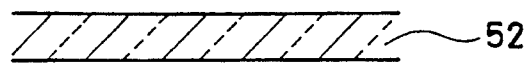
FIGS. 23A-23I are enlarged cross sectional views showing a part of a metal mask and other structure, for use in describing a first example of a manufacturing process for the screen printing plate in accordance with the seventh embodiment.

Referring to FIG. 23A, a glass plate 52 is prepared.

Figure 23B:

Referring to FIG. 23B, a photoresist liquid 54 is applied onto the surface of glass plate 52. After drying the photoresist liquid 54, a mask pattern prepared in accordance with a plan view of thin partition 70 (see FIG. 22) is closely contacted to resist film 54 and the resist film is exposed. Then, resist film 54 is developed and a resist film 56 is obtained. Resist film 56 exposes the part of glass plate 52 in which thin partitions are formed, and covers the glass plate 52 in the other portions. On the rear surface of glass plate 52, a protecting material for protecting against etching 53 is applied and cured or attached.

Figure 23C:
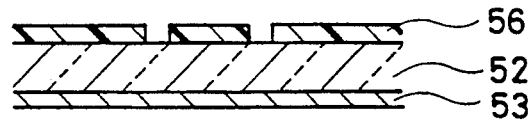
Figure 23D:

Glass plate 52 shown in FIG. 23C is etched, protecting material 53 is peeled off, and then glass plate 52 is washed with water and dried. As shown in FIG. 23D, recesses are formed in the surface of glass plate 52 at positions not covered by resist film 56. These recesses take a shape corresponding to thin partition 70 shown in FIG. 22. If the protective material is adhesively joined, the adhesive must be removed away by solvent.

Figure 23E:
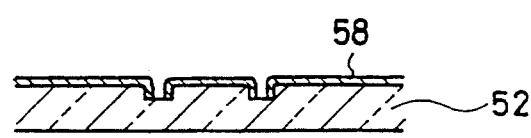

Now referring to FIG. 23E, photoresist layer 56 is stripped off from the surface of glass plate 52. Then, by means of Ag sputtering, an Ag film 58 is formed on the entire surface of glass plate 52. Thus, the surface of glass plate 52 is provided with conductivity.

Figure 23F:
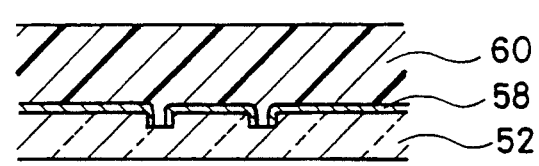
Figure 23G:
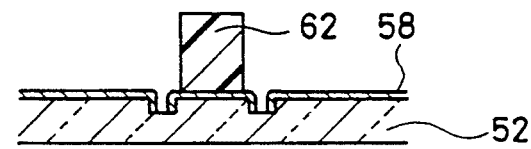

Referring to FIG. 23F, photoresist liquid 60 is further applied to the surfaces of glass plate 52 and Ag film 58. After drying the photoresist liquid 60, a mask pattern corresponding to a plan view of an aperture 68 is registered and closely contacted to resist film 60, and resist film 60 is exposed. Then, resist film 60 is developed and washed with water, thus providing a plate to be treated (glass plate 52 having Ag film 58) having resist film 62 formed at positions corresponding to apertures 68 (see FIG. 22) as shown in FIG. 23G.

Figure 23H:
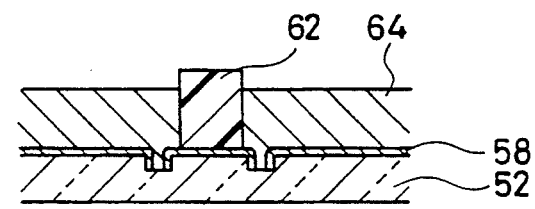

Referring to FIG. 23H, Ni layer 64 having a prescribed thickness is formed on Ag film 58. At that time, Ni layer 64 is not formed in the region in which resist film 62 is present.

Figure 23I:
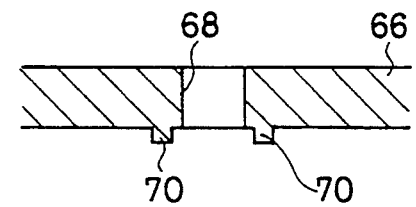

Now, referring to FIG. 23I, resist film 62 is stripped off. Ag film 58 is dissolved. Thus, Ni layer 64 is separated from glass plate 52, and a metal plate 66 of Ni material is obtained. Metal plate 66 has patterned openings formed of a plurality of apertures 68, and thin partitions 70 formed protruding at the circumferential edges of the opening area. Thin partitions 70 are integral parts of metal plate 66.

By the process in FIGS. 23A–23I, the metal mask 102 of the screen printing plate shown in FIG. 22 can be manufactured.

FIGS. 24A–24I illustrates another process of manufacturing the metal mask 102 of the screen printing plate in accordance with the seventh embodiment shown in FIG. 22. The process is, as opposed to the first process, characterized by the use of a metal plate 72 (see FIG. 24A) instead of glass plate 52 (see FIG. 23A).

Figure 24A:
FIGS. 24A-24I are enlarged cross sectional views showing a part of a metal mask and other structure, for use in describing a second example of a manufacturing process for the screen printing plate in accordance with the seventh embodiment.

Now, referring to FIG. 24A, a metal plate 72 formed of a stainless steel or the like is prepared.

Figure 24B:
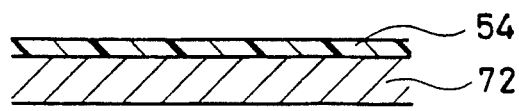
Figure 24C:
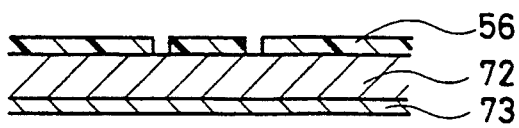
Figure 24D:
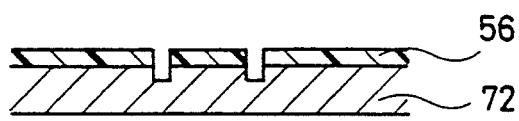

Referring to FIG. 24B, photoresist liquid 54 is applied onto the surface of metal plate 72. After drying the photoresist liquid 54, a mask pattern prepared in accordance with a plan view of thin partition 70 shown in FIG. 22 is closely contacted to photoresist layer 54 and photoresist layer 54 is exposed. Then, photoresist layer 54 is developed and washed with water, and as shown in FIG. 24C, a resist film 56 is formed exposing the surface of metal plate 72 only at the positions corresponding to thin partitions 70 and covering the other parts. Further, a layer of a protecting agent 73 on the rear surface of metal plate 72 is formed.

Figure 24E:
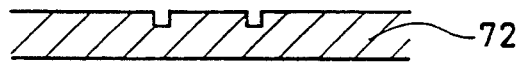

Then, metal plate 72 is etched and recesses are formed on the surface of metal plate 72 at positions corresponding to the shape of thin partitions. Protecting layer 73 and resist layer 56 are stripped off, metal plate 72 is washed with water and the metal plate 72 shown in FIG. 24E is provided.

In the first manufacturing process, as shown in FIG. 23E, the step of forming Ag film 58 is necessary for providing the surface of glass plate 52 with electrical conductivity. However, according to the second manufacturing process, it is not necessary to form an Ag film, because metal plate 72 which is conductive is used as a supporting body.

Figure 24F:
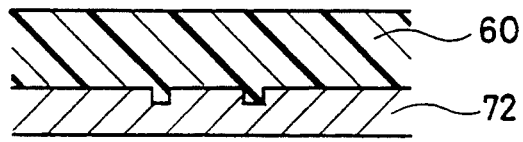
Figure 24G:
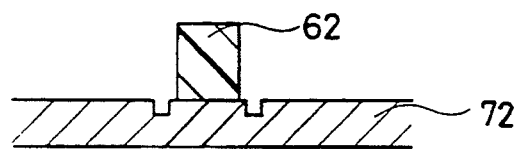

Now, referring to FIG. 24F, a photoresist liquid is applied to the surface of metal plate 72 to form a photoresist layer 60. After drying photoresist layer 60, a mask pattern prepared in accordance with a plan view of small apertures 68 shown in FIG. 22 is closely contacted to the surface of resist layer 60 and resist layer 60 is exposed. Further by developing resist layer 60 and washing the same with water, metal plate 72 having a resist layer 62 formed only at the positions corresponding to small apertures 68 (see FIG. 22) is provided as shown in FIG. 24G.

Figure 24H:
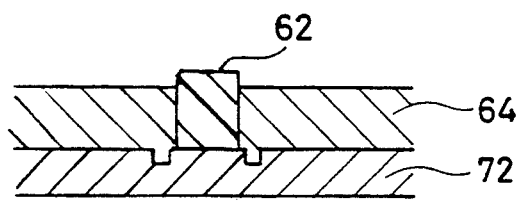

Referring to FIG. 24H, an Ni layer 64 is formed on the surface of metal plate 72 by Ni plating. At the time, no Ni layer 64 is formed in the region of resist layer 62.

Figure 24I:
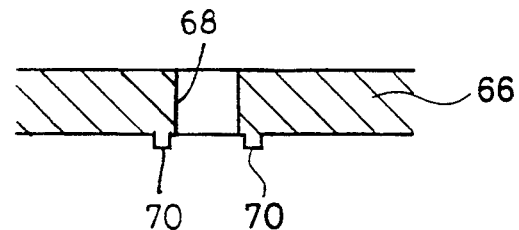

Then, referring to FIG. 24I, resist layer 62 is stripped off, Ni layer 64 is separated from metal plate 72, and a metal plate 66 of Ni material having a number of small apertures 68 is provided. Thin partitions 70 are formed at the circumferential edges of the opening area on the rear surface of metal plate 66. Thin partitions 70 are integral parts of metal plate 66.

The metal mask 102 of the screen printing plate in accordance with the seventh embodiment shown in FIG. 22 can also be provided by the second process as described above.

The first and second manufacturing processes described so far are both techniques taking advantage of Ni plating, and both use what is called a photoelectroforming technique. However, a screen printing plate in accordance with the present invention can be manufactured by using techniques other than such photoelectroforming technique. For example, a photoetching technique may be used. In the following, a description of examples of such a manufacturing technique is given.

Figure 25A:
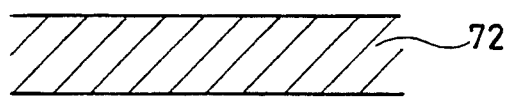
FIGS. 25A-25F are partially enlarged cross sectional views showing a part of a metal mask and others structure, for use in describing a third example of a manufacturing process for the screen printing plate in accordance with the seventh embodiment.

Referring to FIG. 25A, metal plate 72 is prepared as a material for the metal mask 102 of the screen printing plate in accordance with the seventh embodiment.

Figure 25B:
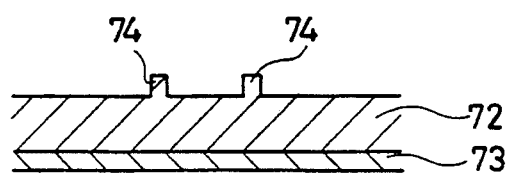

Referring to FIG. 25B, protrusions 74 which are to be thin partitions 70 are formed on the surface of metal plate 72. A photoetching process for forming protrusions 74 includes the steps of applying a photoresist liquid onto the surface of metal plate 72, drying the applied photoresist liquid, forming a prescribed pattern onto the photoresist layer by exposure, developing the photoresist layer, forming a patterned resist film by washing the photoresist layer with water and drying the same, forming a protecting layer 73 on the rear surface of metal plate 72, etching the surface of metal plate 72 using the formed resist film as mask, and stripping off the resist film and washing the surface of metal plate 72 with water and drying metal plate 72.

Figure 25C:
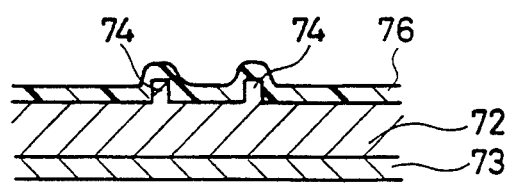
Figure 25D:
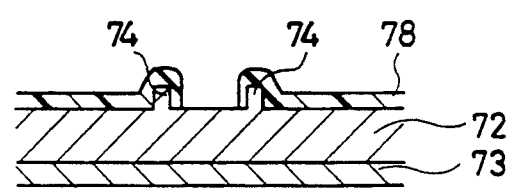

Referring to FIG. 25C, a photoresist liquid 76 is applied onto the surface of metal plate 72 having protrusions 74. The photoresist liquid 76 is dried. Photoresist layer 76 is exposed to light using as mask a mask pattern prepared in accordance with small apertures 68 shown in FIG. 22, developed, washed with water, and dried. Thus, the surface of metal plate 72 are exposed at positions where apertures 68 are to be ultimately formed, as shown in FIG. 25D. The other parts of the surface of metal plate 72 is protected by resist layer 78.

Figure 25E:
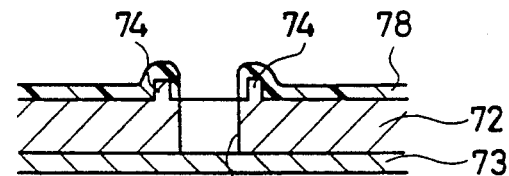

Referring to FIG. 25E, metal plate 72 is etched using resist layer 78 as mask, and a very small through hole 80 is formed on the surface of metal plate 72 at positions exposed by the steps as far as FIG. 25D.

Figure 25F:
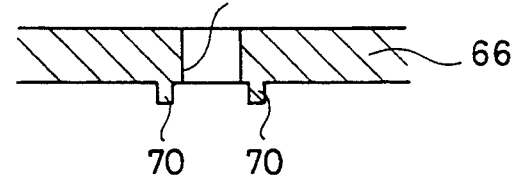

Referring to FIG. 25F, after stripping off resist film 78 and protecting layer 73 from the surface of metal plate 72, metal plate 72 is washed with water, and dried to provide metal plate 66 with small apertures 68 formed therein. At the circumferential edges of the opening area formed of small apertures 68 on the rear surface of metal plate 66, thin partitions 70 are formed. Thin partitions 70 are integrally formed as a part of metal plate 66.

As described above, the screen printing plate in accordance with the seventh embodiment of the present invention shown in FIG. 22 can be provided using the photoetching technique.

FIGS. 26A-26G are enlarged cross sectional views showing a screen printing plate, for use in illustration of a process of manufacturing a screen printing plate having a part of a similar shape to the screen printing plate shown in FIG. 22 by means of photoetching.

Figure 26A:
FIGS. 26A-26G are enlarged cross sectional views showing a part of a metal mask and other structure, for use in describing an example of a manufacturing process for a screen printing plate similar to the screen printing plate in accordance with the seventh embodiment.

Referring to FIG. 26A, metal plate 72 is prepared.

Figure 26B:
Figure 26C:
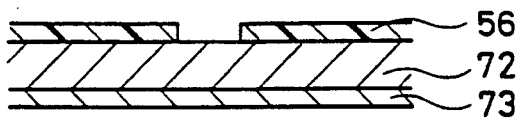

Referring to FIG. 26B, a photoresist liquid 54 is applied to the surface of the metal plate 72, dried, and cooled. Then, resist layer 54 is exposed in accordance with a prescribed mask pattern, resist layer 54 is developed. The surface of metal plate 72 is washed with water and dried, and as shown in FIG. 26C, metal plate 72 having its surface exposed at only the positions where small apertures 68 are formed and the other parts protected by resist layer 56 is obtained. Protecting layer 73 is formed on the rear surface of metal plate 72.

Figure 26D:
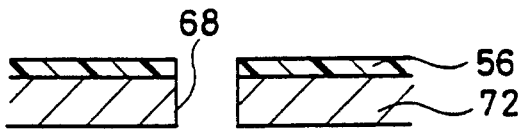

Metal plate 72 shown in FIG. 26C is etched, to form small apertures 68 in metal plate 72 as shown in FIG. 26D. Then, resist layer 56 and protecting layer 73 are stripped off. Metal plate 72 is further washed with water and dried.

Figure 26E:

Referring to FIG. 26E, another resist liquid or an emulsifier 100 is applied onto the entire surface of metal plate 72. A mask pattern prepared in accordance with a plan view of thin partitions is registered and the resist layer 100 is exposed accordingly and developed. Metal plate 72 is further washed with water and dried, thus providing resist layer 100 remaining protruding at the circumferential edges of very small apertures 68 on the surface of metal plate 72 as shown in FIG. 26F.

Figure 26F:
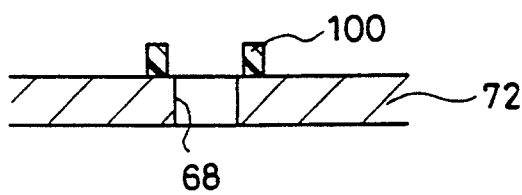
Figure 26G:
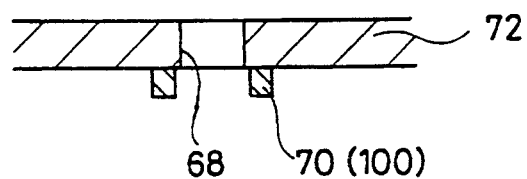

Placement of metal plate 72 shown in FIG. 26F as shown in FIG. 26G provides metal plate 72 having very small apertures 68 and thin partitions 70 (100) formed at the circumferential edges of the openings of small apertures 68 further under the apertures.

A screen printing plate similar to the metal mask 102 of the screen printing plate in accordance with the seventh embodiment can be provided by a process using a photoetching technique as shown in FIGS. 26A-26G. The screen printing plate is different from, for example, the manufacturing process illustrated in conjunction with FIGS. 25A–25F in that thin partitions 70 are not formed integral parts of metal plate 72. However, the screen printing plate is substantially identical to that shown in FIG. 25F in terms of functions.

Figure 27:
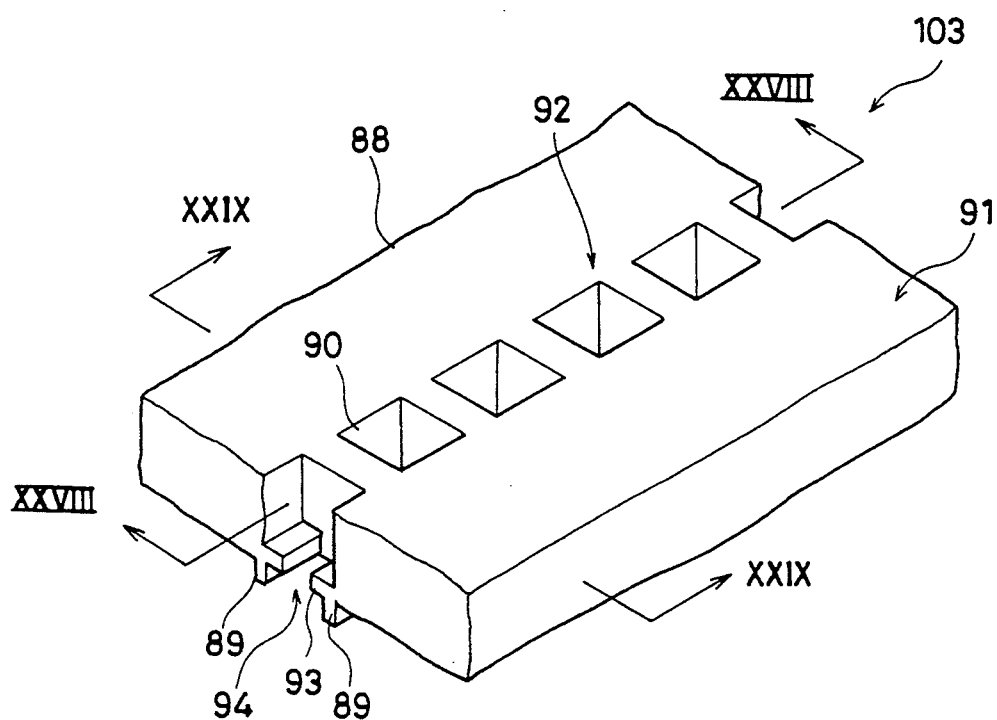
FIG. 27 is an enlarged perspective view showing a part of an eighth embodiment of a screen printing plate in accordance with the present invention.

FIG. 27 is an enlarged perspective view showing a part of the metal mask 103 of a screen printing plate in accordance with the eighth embodiment of the present invention. Screen printing plate in accordance with the eighth embodiment, in departure from the screen printing plates described above, requires more steps for the manufacture, but allows an improved printing precision, and the edges of printed lines will be clearer.

Referring to FIG. 27, the metal mask 103 of the screen printing plate has a metal plate 88 having a surface divided into an opening area 92 and a non-opening area 91. In opening area 92, a number of very small apertures 90 are formed. A cross sectional shape of small aperture 90 is as shown in FIGS. 27–29H.

Figure 29A:
FIGS. 29A-29H are enlarged cross sectional views showing a part of a metal mask and other structure taken along line XXIX—XXIX shown in FIG. 27 for use in describing a manufacturing process in accordance with the eighth embodiment.
Figure 29B:
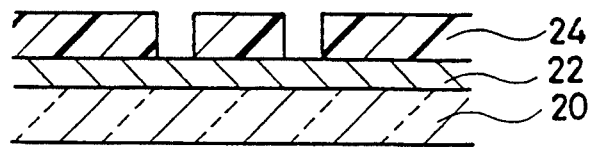
Figure 29C:
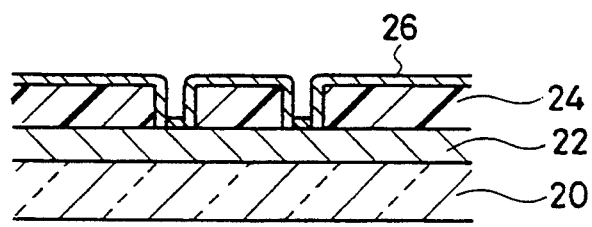
Figure 29D:
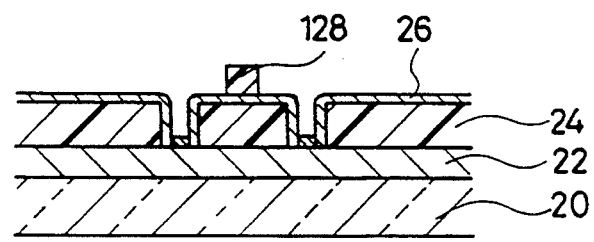
Figure 29E:
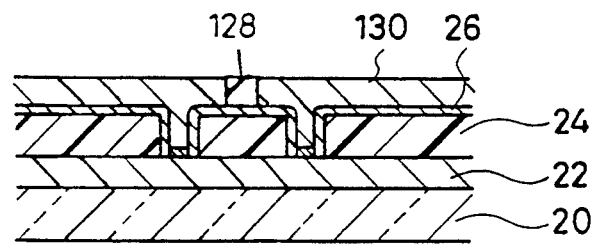
Figure 29F:
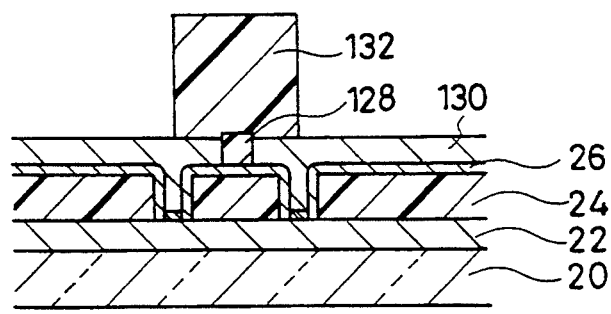
Figure 29G:
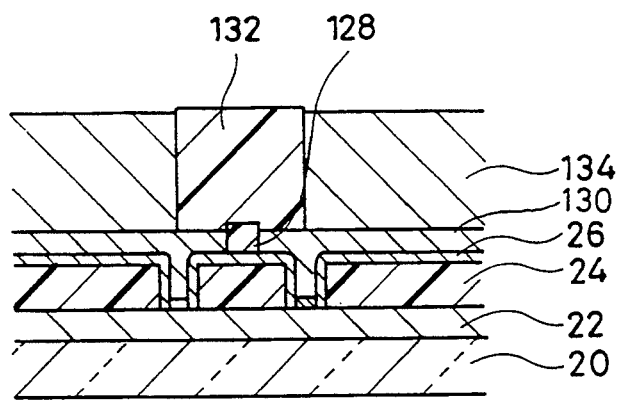
Figure 29H:
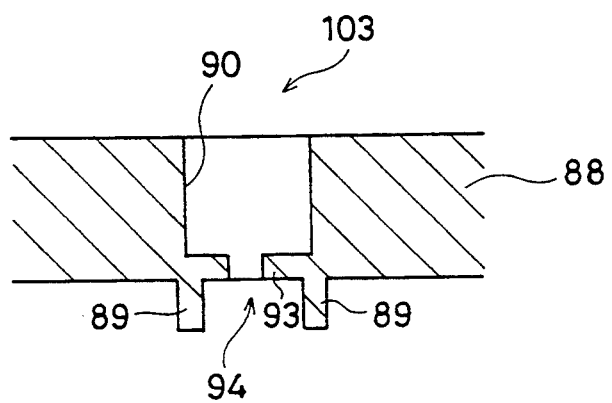

Thin partitions 89 are seen in FIGS. 27 and 29H projecting rearward from the rear or bottom surface of metal plate 88. In the vicinity of small apertures 90 in the rear surface of metal plate 88 are a pair of inner bottom plates 93 extending inside small aperture 90 and having a rectangular bottom opening 94. The inner bottom plates 93 are in parallel to the rear surface of metal plate 88. Formed at the circumferential edges of opening area 92 in the rear surface of metal plate 88 are thin partitions 89 having a prescribed height from the rear surface of metal plate 88. In this embodiment, the longitudinal sidewise direction of bottom opening 94 and the direction in which thin partitions 89 extend are parallel to each other.

Figure 28:
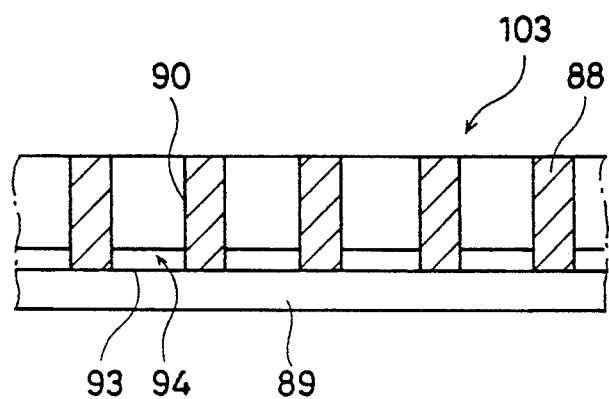
FIG. 28 is a partially cross sectional view showing a metal mask taken along line XXVIII—XXVIII shown in FIG. 27.

FIG. 28 is a cross sectional view taken along the direction of XXVIII—XXVIII shown in FIG. 27. As can be seen from FIG. 28, the shape of small aperture 90 in this cross section is rectangular, and bottom opening 94 is not narrowed by inner bottom plates 93 in this cross section.

FIG. 29H is a cross sectional view taken along the direction of XXIX—XXIX of FIG. 27 showing the metal mask 103 of a screen printing plate. Referring to FIG. 29H, small aperture 90 in this cross section is narrowed by inner bottom plates 93 protruding from the opposing sides in the bottom opening, leaving bottom opening 94. A space having an area larger than the area of bottom opening 94 defined by thin partitions 89 is defined further below bottom opening 94.

If a straight line, for example, is printed using the metal mask 103 of a screen printing plate having a shape as shown in FIG. 27, a straight line thinner than the one printed by a conventional screen printing plate can be printed, and the forms of its edges turn out to be clearer with less unevenness as compared to a result of printing using the conventional screen printing plate.

FIGS. 29A–29H are cross sectional views taken along XXIX—XXIX shown in FIG. 27, for use in illustrating a manufacturing process for making a screen printing plate in accordance with the eighth embodiment.

Referring to FIG. 29A, ITO film 22 is formed on glass plate 20.

Referring to FIG. 29B, a resist layer 24 exposing only the part of ITO film 22 which corresponds to a plan view of thin partitions 89 shown in FIG. 27 is formed by a known process. The process of forming resist layer 24 is the usual process discussed above and, therefore, a detailed description thereof will not be repeated here.

Referring to FIG. 29C, Ag film 26 is formed on the surface of resist layer 24, and a plate to be treated which is formed of glass plate 20, ITO film 22, and resist layer 24 is provided with conductivity on its entire surface.

Referring to FIG. 29D, a resist film 128 is formed on resist layer 24 at positions corresponding to bottom opening 94 shown in FIG. 27. A method of forming resist film 128 is also the usual process already discussed and, therefore, a detailed description thereof will not be repeated herein.

Referring to FIG. 29E, a Ni layer 130 having a prescribed thickness is formed on Ag film 26 by Ni plating. The top surface of the formed Ni layer 130 defines the top surface of inner bottom plate 93 shown in FIG. 27.

Referring to FIG. 29F, a resist film 132 is formed at positions corresponding to small apertures 90 shown in FIG. 27. Resist film 132 can be formed by a known process, and a detailed description will not therefore be repeated about that process.

Referring to FIG. 29G, an Ni layer 134 is formed on Ni layer 130 by Ni plating. Prior to the formation of Ni layer 134, the surface of Ni layer 130 must be treated with perchloric acid. After the formation of Ni layer 134, the plate to be treated is washed with water.

Referring to FIG. 29G, Ni layers 130 and 134 are separated from glass plate 20 and ITO film 22. Resist films 24, 128 and 132 are dissolved. Finally, by dissolving Ag film 26, metal plate 88 having a number of very small apertures 90 having a cross sectional shape as shown in FIG. 29H is provided. Thin partitions 89 formed integrally as a part of metal plate 88 are formed at the circumferential edges of the opening area on the rear surface of metal plate 88. The metal mask 103 of screen printing plate shown in FIG. 27 can be provided by the process shown in FIGS. 29A–29H.

A description of a specific example of the manufacturing process shown in FIGS. 29A–29H follows.

Photoresist AZ4210 (a product from Hoechst JAPAN Co., Ltd.) was used for resist film 24 shown in FIG. 29B. Photoresist is applied onto ITO film 22 as thick as 5.5 $\mu$m, and prebaked for 30 minutes at a temperature of 100° C. Thereafter, the resist film is left on standing and cooled. A mercury lamp (exposure power 30 mW/cm$^2$) is used for exposing a pattern, and exposure of 110 mJ/cm$^2$ is conducted. Development is conducted by immersing the plate to be treated into a developing agent at a temperature of 23° C. for 4 minutes. After the development, the surface of the plate is washed with pure water. After the washing with water, the plate is blown dried and post-baked for 30 minutes at a temperature of 140° C.

A D.C. sputtering device was used for forming Ag film 26 shown in FIG. 29C. Ag sputtering is conducted by sputtering treatment for eight minutes with a current of 110 mA, voltage of 2, 800 V in an argon gas atmosphere, using the D.C. sputtering device.

Resist film 128 for forming the bottom opening shown in FIG. 29D was formed using AZ4330 (a product from Hoechst JAPAN Co., Ltd.) as a photoresist. The photoresist liquid is applied as thick as 5 $\mu$m onto the surface of glass plate 20 and ITO film 22 on which resist layer 24 and Ag film 26 are formed. Thereafter, the photoresist liquid is prebaked for 30 minutes at a temperature of 100° C. and cooled on standing. A mask pattern for forming a bottom opening is registered and closely contacted to the resist layer, exposure of light of 640 mJ/cm$^2$ is conducted thereon using the above-stated mercury lamp. Development is conducted by immersing the plate into a developing agent at a temperature of 23° C. for four minutes. After the development, the surface of the plate to be treated is washed with pure water, dried under a little wind, and post-baked for 30 minutes at a temperature of 115° C.

In FIG. 29E, Ni plating is conducted as follows. First prepared is a nickel sulfamic acid bath including a luster agent. The plate shown in FIG. 29D is immersed into the nickel sulfamic acid bath, and a plating treatment for 10 minutes with a current of 10A is conducted thereon. After the Ni plating is complete, the plate is washed with water and dried.

Resist film 132 shown in FIG. 29F is formed as follows. AZ4903 (a product by Hoechst JAPAN Co., Ltd.) is used for a photoresist. The photoresist liquid is applied onto the surface of Ni layer 130 as thick as 32 $\mu$m. The photoresist layer is prebaked for 40 minutes at a temperature of 100° C., and cooled on standing. Then, a mask pattern for forming small apertures is registered and closely contacted to the surface of the resist film, and exposure of light of 1380 mJ/cm$^2$ is conducted using the above-stated mercury lamp. The plate after the exposure is immersed in a developing agent of a temperature of 23° C. for six minutes and 30 seconds. After the development, the plate was washed with pure water, dried by blowing, and post-baked for 30 minutes at a temperature of 115° C. The surface of Ni layer 130 is treated with perchloric acid and washed with water.

Ni layer 134 in FIG. 29G is formed as follows. First prepared is a nickel sulfamic acid bath including a luster agent. The plate to be treated, shown in FIG. 29F, is immersed into the nickel sulfamic acid bath, and a plating treatment is conducted for 70 minutes with a current of 10A.

A 5% caustic soda aqueous solution is used for dissolving resist films 24, 128 and 132 shown in FIG. 29G. Ag film 26 is dissolved by soaking the plate in an Ag etching liquid formed of a mixed aqueous solution of Cerium (IV) Diammonium Nitrate and perchloric acid for 60 seconds.

The applicant manufactured a screen printing plate in accordance with the above-stated process, and obtained thin partitions 89 having a width of 4 $\mu$m and a height of 5 $\mu$m. The length of small aperture 90 (the thickness of Ni layer) was 25 $\mu$m. Printing using a printing plate screen manufactured by using the steps described by reference to FIGS. 29A-29H produced a line having clearer edges with less unevenness as compared to printing by a conventional screen printing plate.

Figure 30:
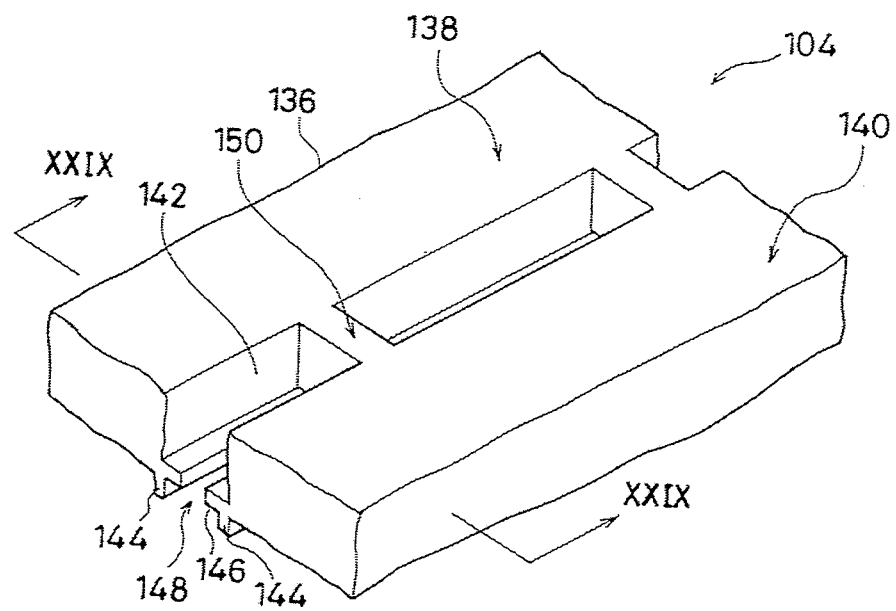
FIG. 30 is an enlarged perspective view showing a part of a ninth embodiment of a screen printing plate in accordance with the present invention.

FIG. 30 is an enlarged perspective view showing a part of the metal mask 104 of a screen printing plate in accordance with the ninth embodiment of the present invention, which is a slight modification of the screen printing plate shown in FIG. 27. Referring to FIG. 30, screen printing plate 104 includes a metal plate 136 having a surface divided into an opening area 138 and a non-opening area 140. A number of very small apertures 142 having a rectangular form are arranged in opening area 138 with their short sides separated by bridges 150. A cross section taken along XXIX—XXIX shown in FIG. 30 is identical to the one shown in FIG. 29H. More specifically, the metal mask 104 of the screen printing plate in accordance with the ninth embodiment is formed by modifying small aperture 90 in the eighth embodiment shown in FIG. 27 to have a rectangular form having long sides in the direction of arrangement of small apertures 90. A process of manufacturing the metal mask 104 of the screen printing plate in accordance with the ninth embodiment is the same as the process already discussed in conjunction with FIGS. 29A-29H. However, plan views of resist film 128 shown in FIG. 29D and resist film 132 shown in FIG. 29F are different from those in accordance with the eighth embodiment.

Referring to FIG. 30, inner bottom plates protruding from the opposite sides are formed on the bottom of each of small apertures 142 leaving a bottom opening 148. Thin partitions 144 are formed to surround the circumferential edges of opening area 138 on the bottom surface of metal plate 136 under inner bottom plates 146.

Figure 31:
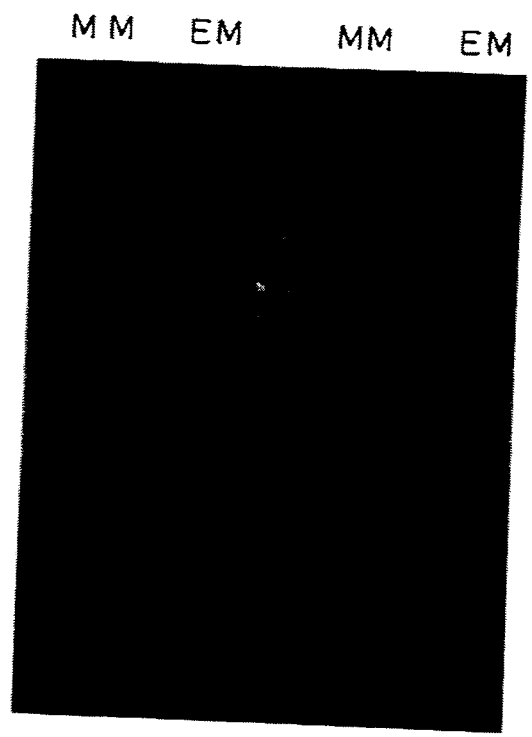
FIG. 31 is a plan view of results of printing showing in comparison a result of printing in accordance with the ninth embodiment and a result of printing in accordance with a conventional technique.
Figure 32A:
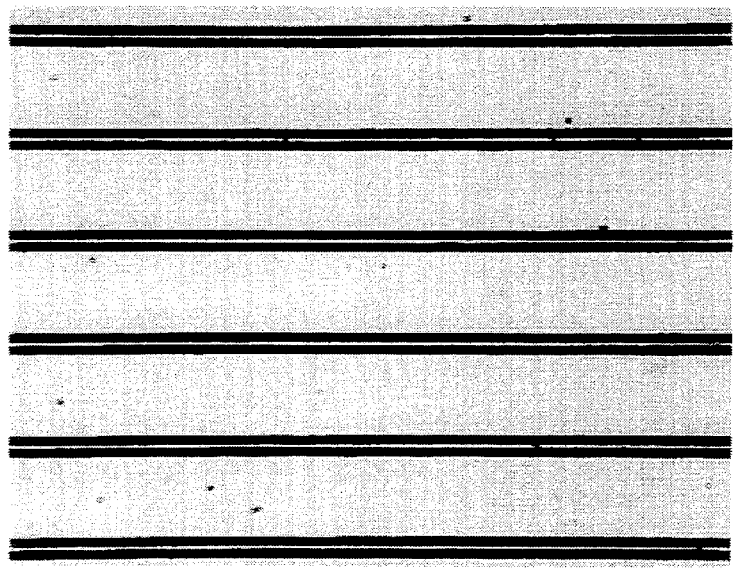
FIGS. 32A-32D are photographs of a result of printing of a line of a thickness 20 $\mu$m in accordance with the ninth embodiment, enlarged, respectively at 100 power, 200 power, 400 power, and 800 power.
Figure 32B:
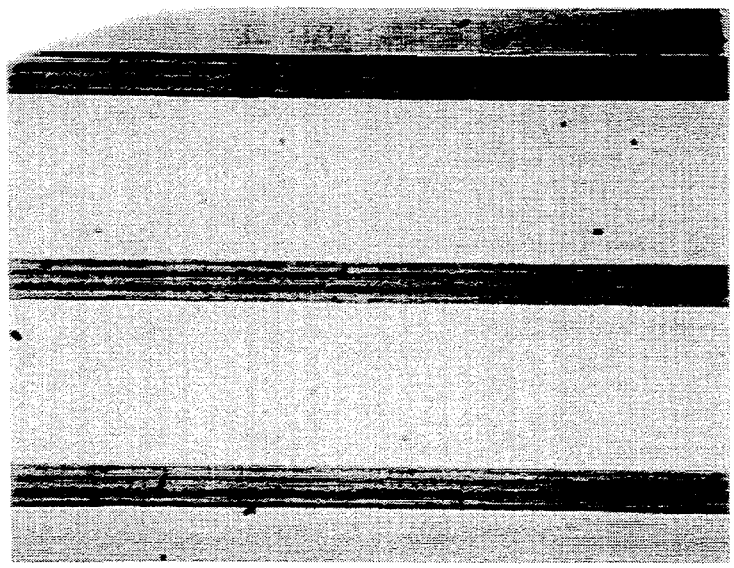
Figure 32C:
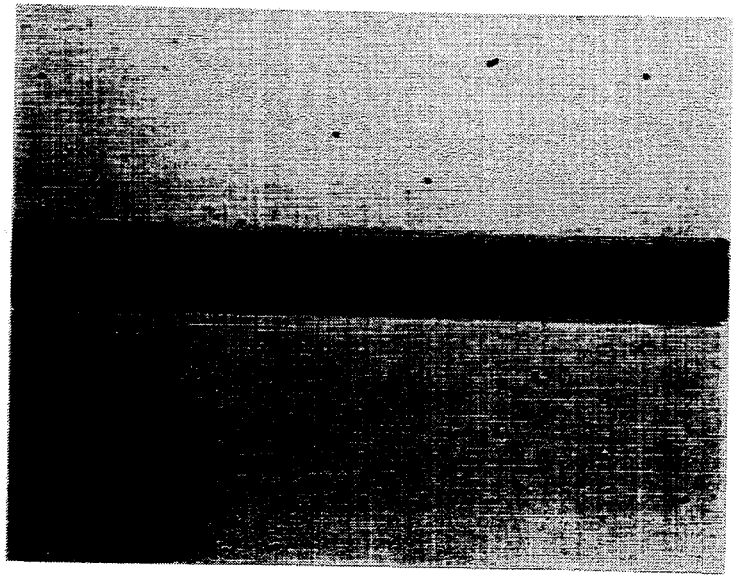
Figure 32D:
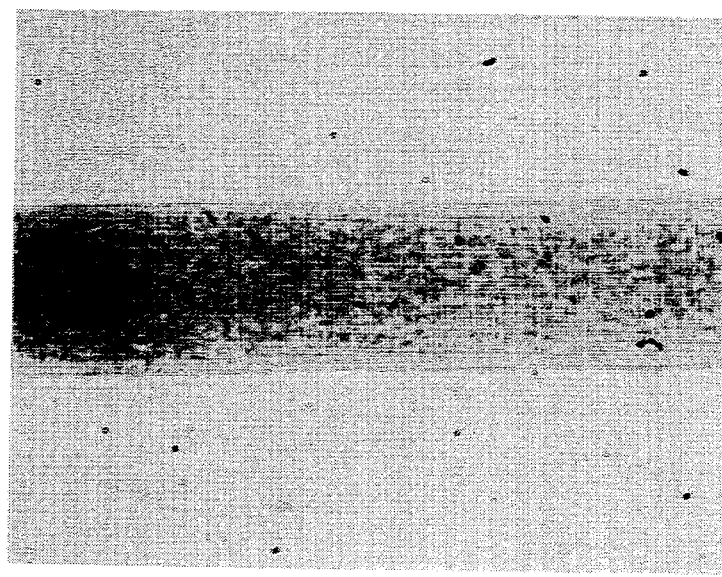

FIG. 31 is an enlarged photograph for comparing a line printed by the metal mask 104 of the screen printing plate in accordance with the ninth embodiment (a line designated by "MM" in FIG. 31) and a line printed by a screen printing plate manufactured by a conventional method. The width of lines shown in FIG. 31 are both about 100 $\mu$m.

As can be seen from FIG. 31, the edges of the line printed using the screen printing plate in accordance with the ninth embodiment has far less unevenness and are clearer than the edges of the line printed by the conventional screen printing plate. More specifically, by utilizing the screen printing plate produced in accordance with the ninth embodiment, printing of higher quality than by the conventional screen printing plate can be provided. Such higher quality printing being highly sophisticated and with high precision.

The applicant printed out a line having a width of about 10 $\mu$m, using the metal mask 104 of the screen printing plate in accordance with the ninth embodiment shown in FIG. 30, and the printing result was far higher in quality as compared to the case of using a conventional printing plate. At that time, the width of very small aperture 142 was 80 $\mu$m, the width of bridge 150 was 20 $\mu$m, the width of bottom opening 148 was 5 $\mu$m, the distance between the inner edges of thin partition 144 was 10 $\mu$m, the thickness of each thin partition 144 was 4 $\mu$m, and the height of metal plate 136 from the bottom surface was 5 $\mu$m.

The applicant also printed crossing lines of 10 $\mu$m using the screen printing plate 104 shown in FIG. 30, and a fine printing was obtained without the spreading of the ink at the crossing portion.

Figure 33A:
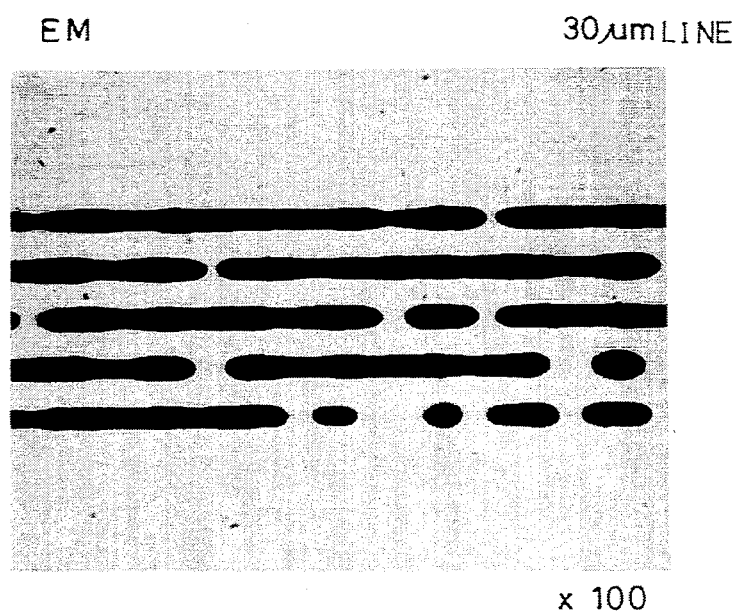
FIGS. 33A and 33B are photographs, both enlarged at 100 power, showing results of printed lines of thicknesses 30 $\mu$m and 40 $\mu$m in accordance with the conventional technique.

FIGS. 32A-32D are photographs enlarged at 100 power, 200 power, 400 power, and 800 power, respectively, showing a result of printing a line having a width of 20 $\mu$m, using a screen printing plate as shown in FIG. 30. FIG. 33A is an enlarged view showing results of printing lines having widths of 30 $\mu$m and 40 $\mu$m, respectively, using a conventional emulsifier both enlarged at 100 power.

As shown in FIG. 33A, the quality of printed line having a width of 30 $\mu$m printed using the conventional emulsifier plate is very poor. The line of the width 40 $\mu$m shown in FIG. 33B has much unevenness at its edges, and can hardly be said to be of fine quality.

Figure 33B:
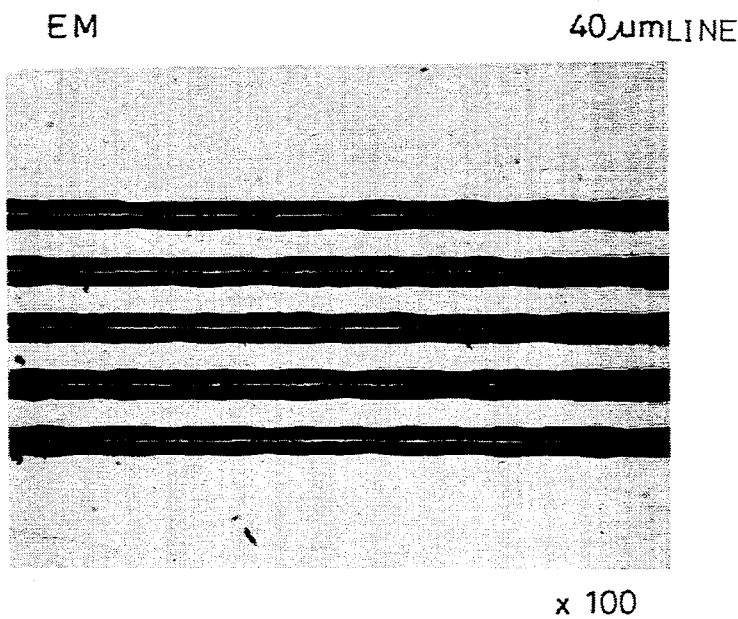

Conversely, as shown in FIGS. 32A-32D, the line printed using the screen printing plate in accordance with the present invention, notwithstanding that its width 20 $\mu$m is smaller than the widths of the lines shown in FIGS. 33A and 33B, has no interruption of the ink or the unevenness of the edges, and a very clear printing result was obtained. Because it can form a line having such clear edges, the screen printing plate in accordance with the present invention can be applied in fields requiring a finer printing technique, such as the field of electronic parts.

The screen printing plate in accordance with the present invention results in obtaining not only high in quality printing as described above, but also advantageously reduces the necessity of cleaning the plate surface at the time of printing. In conventional screen printing, after printing a number of sheets, the plate surface becomes dirty. Therefore, the plate surface must be cleaned and the dirt should be removed for maintaining printing qualities. In the case of a conventional metal mask, the plate surface must be cleaned after printing every 20 sheets to 30 sheets. Also in the case of the conventional emulsifier plate, the plate surface must be cleaned after printing every several hundreds of sheets.

In contrast, using the screen printing plate in accordance with the present invention, no problem took place in printing qualities until after printing about 1000 sheets, and it was substantially unnecessary to clean the plate surface.

Figure 34A:
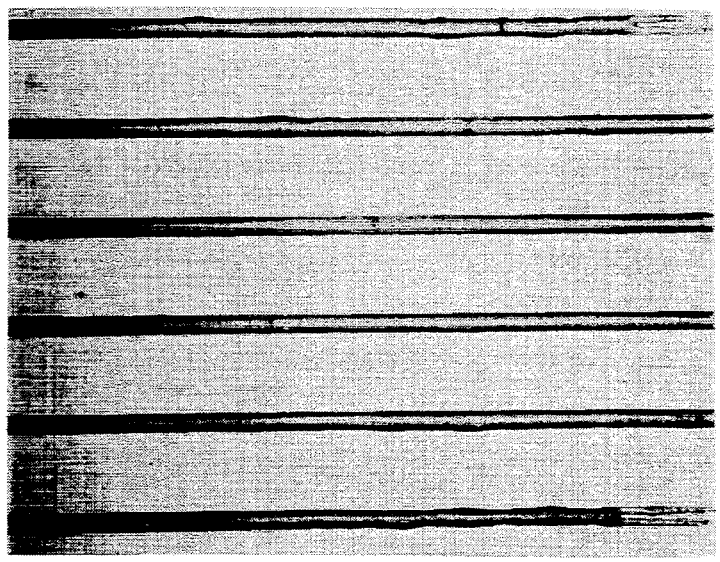
FIGS. 34A and 34B are photographs showing a result of printing a line of a thickness 20 $\mu$m printed on the eighth sheet in accordance with the ninth embodiment, enlarged, respectively at 100 power and 200 power.
Figure 34B:
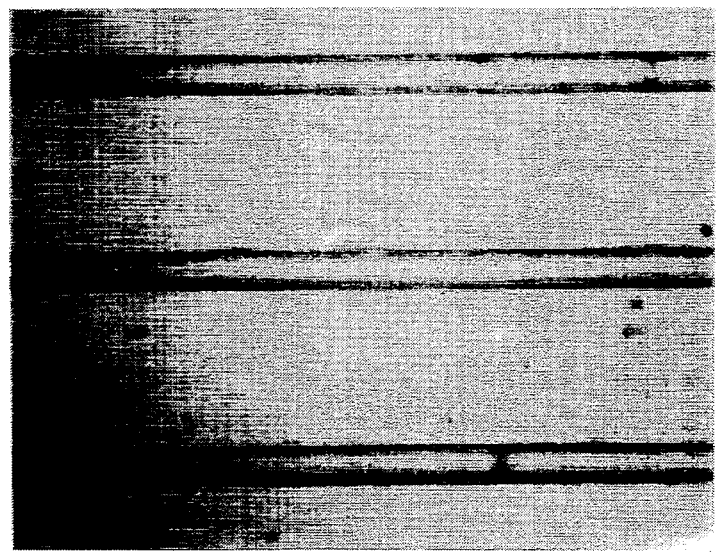
Figure 35A:
FIGS. 35A and 35B are photographs showing a result of printing the line of thickness 20 μm on the 200th sheet in accordance with the ninth embodiment respectively at 100 power and 200 power.
Figure 35B:
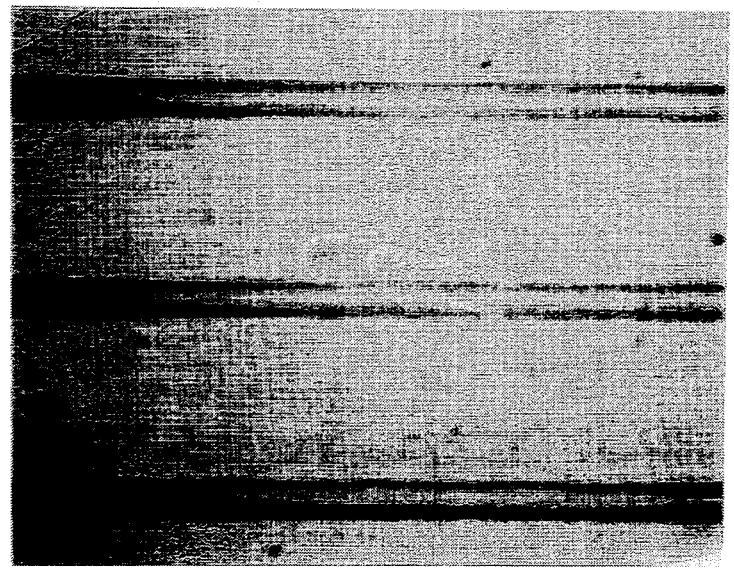

FIGS. 34A and 34B are photographs enlarged at 100 power and 200 power, respectively showing results of printing a sheet after printing seven sheets, when a line of a width 20 μm is printed out using the screen printing plate in accordance with the ninth embodiment shown in FIG. 30. FIGS. 35A and 35B are photographs enlarged at 100 power and 200 power, respectively, showing results of printing a sheet after 199 sheets printed, when printing continues using the same screen printing plate.

As can be seen from FIGS. 34A–35B, there is virtually no difference between the result of printing the eighth sheet and the result of printing the 200-th sheet, and degradation in printing qualities due to stains on the plate surface was not observed.

As described above, according to the screen printing plate in accordance with the present invention, an interval for cleaning the plate surface can be longer than the conventional screen printing plate, thus increasing printing efficiency and maintaining good printing quality.

Figure 36:
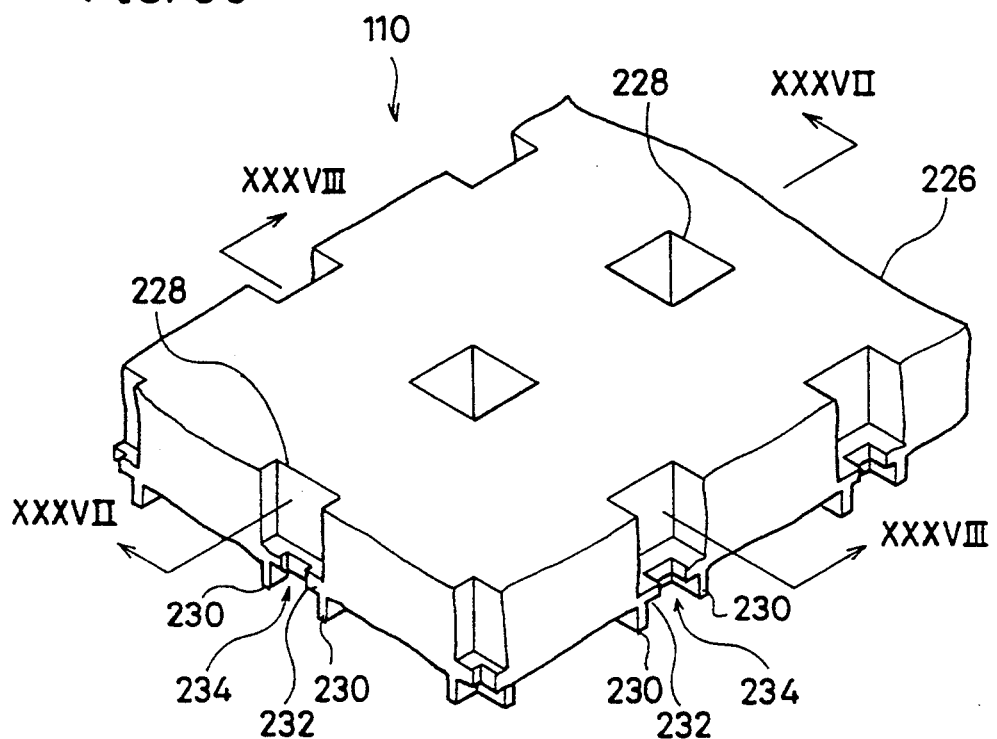
FIG. 36 is an enlarged perspective showing a part of a tenth embodiment of a screen printing plate in accordance with the present invention.
Figure 37:
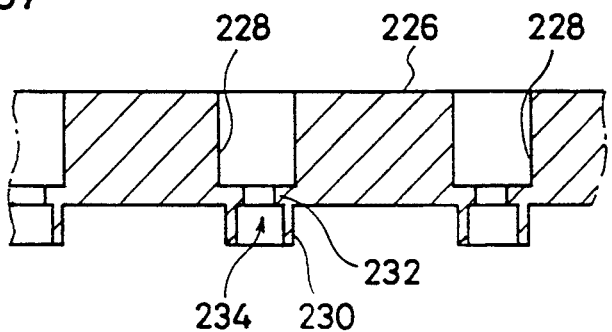
FIG. 37 is an enlarged cross sectional view showing the metal mask taken along line XXXVII—XXXVII shown in FIG. 36.
Figure 38:
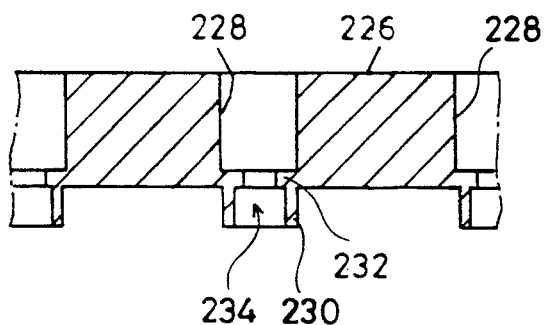
FIG. 38 is an enlarged cross sectional view showing the metal mask taken along line XXXVIII—XXXVIII shown in FIG. 36.
Figure 39:
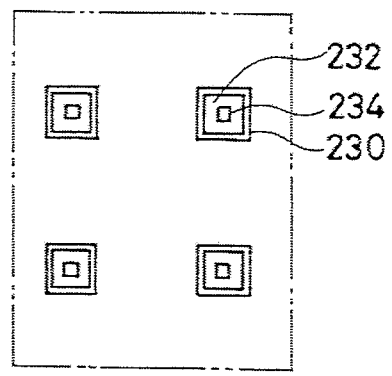
FIG. 39 is an enlarged rear view showing a part of the metal mask shown in FIG. 36.

FIG. 36 is an enlarged perspective view showing a part of the metal mask 110 of a screen printing plate in accordance with the tenth embodiment of the present invention. Referring to FIG. 36, the metal mask 110 of screen printing plate includes a metal plate 226 having a number of very small apertures 228. Inner bottom plates 232 protruding from the periphery are formed in the positions of each small aperture 228 in the vicinity of the rear surface of metal plate 226, and a bottom opening 234 is defined at the central portion by inner bottom plates 232. Thin partitions 230 having a square form surrounding bottom opening 234 of aperture 228 are formed as shown in FIG. 39 on the rear surface of metal plate 226. The height of thin partition 230 from the rear surface of metal plate 226 is fixed.

A cross section of aperture 228 of the screen printing plate in accordance with the tenth embodiment is similar to the cross section of aperture 90 in accordance with the eighth embodiment shown in FIG. 28, but is different from aperture 90 of the eighth embodiment in that inner bottom plates 232 protrude from four sides toward the center. As opposed to bottom opening 94 in accordance with the eighth embodiment which has a long rectangular shape, bottom opening 234 in accordance with the tenth embodiment has a square shape.

As can be seen from the figures, a cross section of aperture 228 in the present embodiment is square.

The screen printing plate in accordance with the tenth embodiment is for printing dots by apertures 228. Ink pressed by a squeegee (not shown) into apertures 228 reaches the space defined by the rear surface of metal plate 226, thin partitions 230, and the surface to be printed through bottom opening 234, and is likely to spread over the surface to be printed. At that time, the provision of thin partitions 230 restrict the spreading of the ink and the ink will not therefore spread further beyond thin partitions 230. Since thin partition 230 is in a square shape, a plan view of the ink transferred onto the surface to be printed also takes a square shape.

Figure 40:
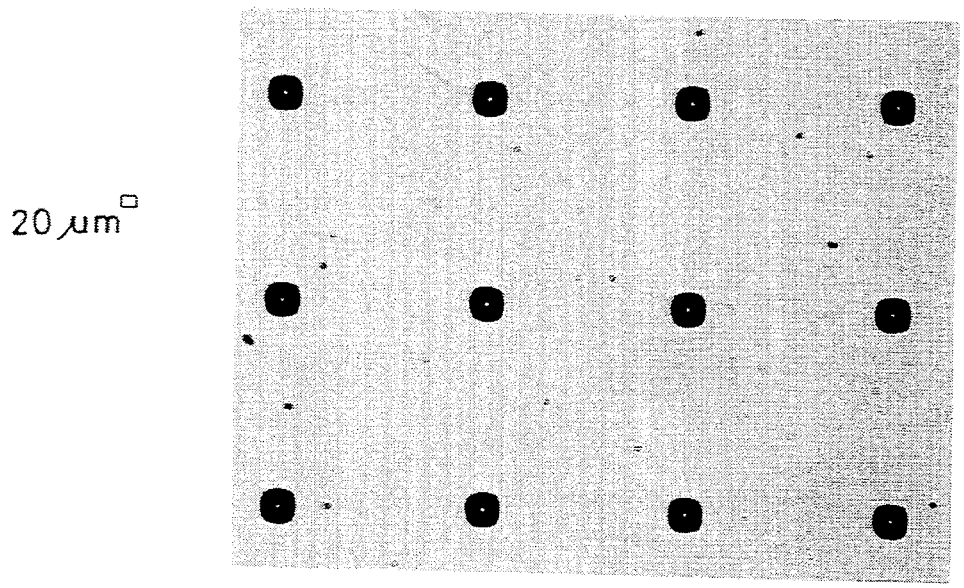
FIGS. 40–42 are photographs enlarged at 200 power showing results of printed dots in accordance with the tenth embodiment having sides of 20 μm, 30 μm, and 40 μm, respectively.
Figure 41:
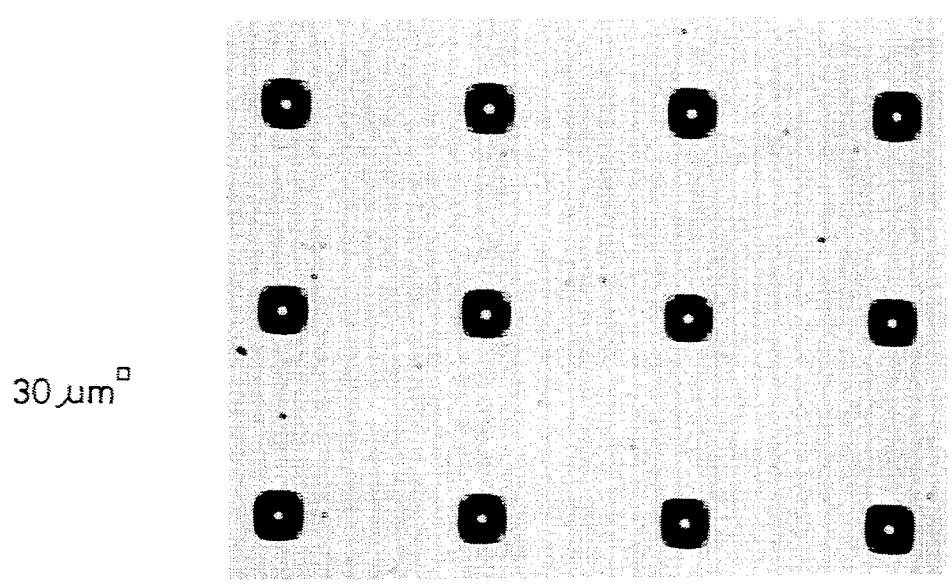
Figure 42:
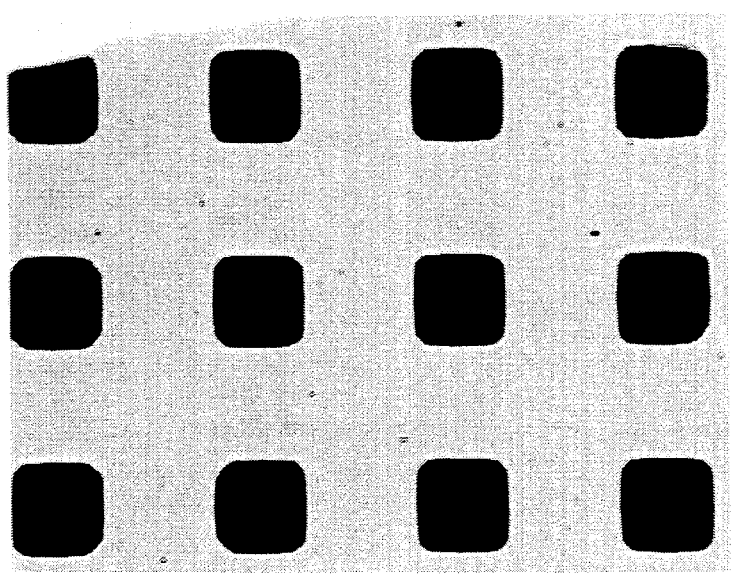

FIGS. 40, 41, and 42 show results of printing square dots having one side of 20 μm, 30 μm, and 40 μm, respectively, using the screen printing plate in accordance with the tenth embodiment. As can be seen from FIGS. 40–42, when dots are printed using the screen printing plate, the edge of each dot has little unevenness and is sharp and clear. The qualities of resulting printing are improved compared to those qualities in printing obtained by utilizing screens that are of conventional construction.

Figure 43:
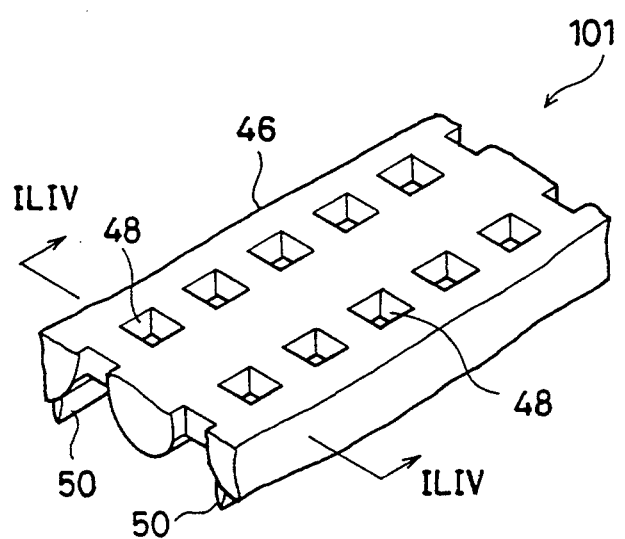
FIG. 43 is an enlarged perspective view showing a part of an eleventh embodiment of a screen printing plate in accordance with the present invention.

FIG. 43 is an enlarged perspective view showing a part of the metal mask 101 of a screen printing plate in accordance with the eleventh embodiment of the present invention. Referring to FIG. 43, the metal mask 101 of the screen printing plate has a number of very small apertures 48 arranged in rows. A pair of thin partitions 50 are formed on the bottom surface of metal plate 46 to the left and right of two rows of apertures 48. Though not shown in FIG. 43, thin partitions 50 are coupled by similar thin partitions at the ends of the two rows of apertures 48.

Also in the case of the metal mask 101 of the screen printing plate in accordance with the eleventh embodiment, ink is pressed into the side of the rear surface of metal plate 46 by a squeegee (not shown) through the two rows of apertures 48, and reaches the surface of a material to be printed. The ink is likely to spread over the surface to be printed, but restrained from spreading by thin partitions 50. The ink does not spread further beyond the outer edges of thin partitions 50. Inside thin partitions 50, the ink which has reached the surface of the material to be printed through different apertures 48 come together into one. As a result, according to the metal mask 101 of the screen printing plate, a line having its edges defined by the outer edges of thin partitions 50 is printed. With the edges of the line to be printed being defined by the outer edges of thin partitions 50 as described above, the degree of spreading of the ink is uniform at any part of the edges. As a result, the unevenness of the edges will be less than that of a conventional screen printing plate and the edges are sharp and clear.

FIGS. 44A–44F are cross sectional views showing the metal mask 101 taken along ILIV—ILIV shown in FIG. 43, for use in illustration of a process of manufacturing the metal mask 101 of the screen printing plate in accordance with the eleventh embodiment.

Figure 44A:
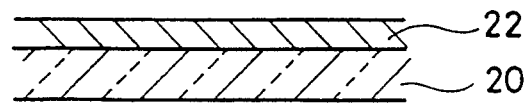
FIGS. 44A–44F are enlarged cross sectional views showing a part of a metal mask and other structure, for use in describing a manufacturing process for the screen printing plate in accordance with the eleventh embodiment.

Referring to FIG. 44A, ITO film 22 is formed on the surface of glass plate, and conductive glass is prepared.

Figure 44B:
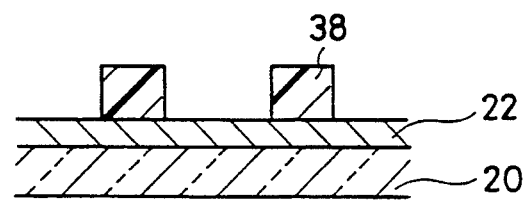

Referring to FIG. 44B, a resist film 38 is formed at a position corresponding to the opening of a desired screen printing plate. A process of forming resist film 38 is a usual process and, therefore, a further description will not be repeated herein.

Figure 44C:
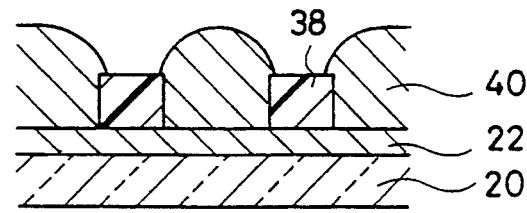

Referring to FIG. 44C, the surface of ITO film 22 is subjected to Ni plating, to form an Ni layer 40 on the surface of ITO film 22 at positions where the resist film 38 is not formed. After the Ni plating, the plate to be treated is washed with water and dried.

Figure 44D:
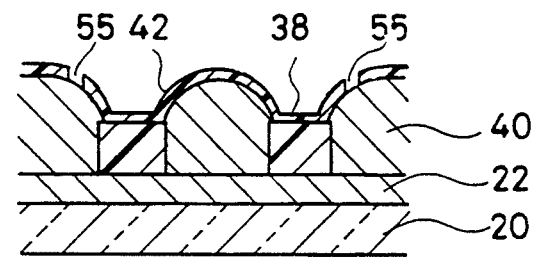

Referring to FIG. 44D, a resist film 42 is formed, and the film 42 having openings at positions where thin partitions 50 shown in FIG. 43 are formed. Resist film 42 is formed by a usual process and, therefore, a further description thereof will not be repeated here.

Figure 44E:
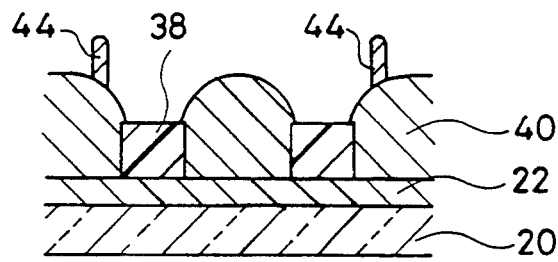

The surface of the plate to be treated is once again subjected to Ni plating, resist film 42 is removed away, and an Ni protruding body 44 shown in FIG. 44E is formed.

Figure 44F:
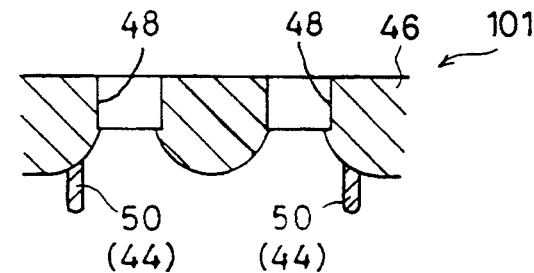

Referring to FIG. 44F, resist film 38 is stripped from the plate to be treated, Ni layer 40 is separated from glass plate 20 and ITO film 22, and the metal mask 101 of the screen printing plate is provided. In the metal mask 101 of the screen printing plate, thin partitions 50 are formed by Ni protruding bodies 44 shown in FIG. 44E. Very small apertures 48 are formed by spaces left behind in metal plate 46 after resist film 38 shown in FIG. 44E is removed away. Also in the metal mask 101 of the screen printing plate, metal plate 46 and thin partitions 50 are both formed of Ni materials, and thin partitions 50 are integral parts of metal plate 46.

Figure 45:
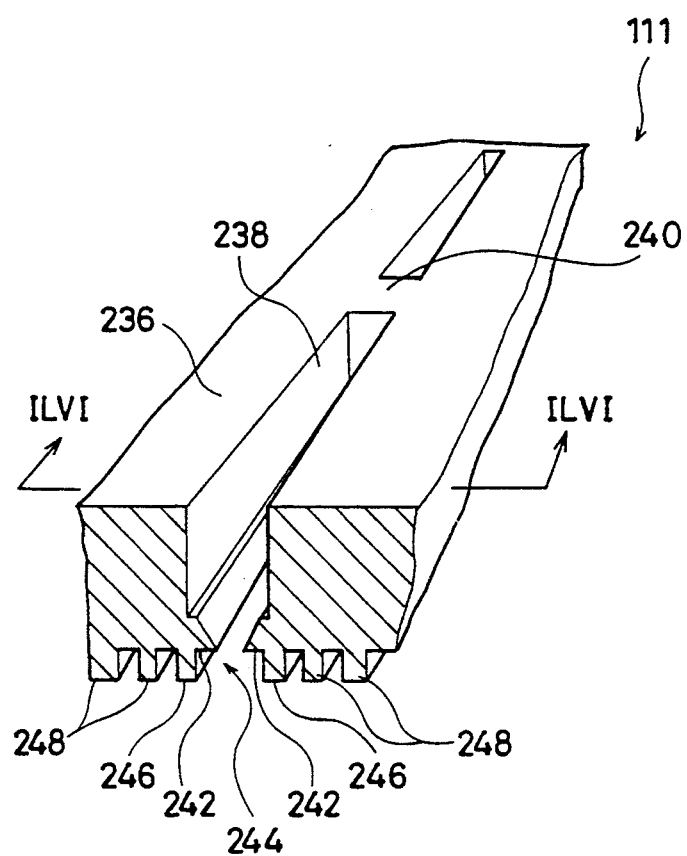
FIG. 45 is an enlarged perspective view showing a part of a twelfth embodiment of a screen printing plate in accordance with the present invention.

FIG. 45 is a partially cut away and enlarged perspective view showing a part of the metal mask 111 of a screen printing plate in accordance with the twelfth embodiment of the present invention. The metal mask 111 of the screen printing plate in accordance with the twelfth embodiment includes a metal plate 236 having a plurality of very small apertures 238 of a rectangular form, which are separated by bridges 240. A pair of inner bottom plates 242 protruding from the lengthwise sides of aperture 238 toward the center are formed in the vicinity of the rear surface of metal plate 236 in aperture 238, and the space between inner bottom plates 242 constitutes a bottom opening 244. The form of bottom opening 244 is rectangular.

On the rear surface of metal plate 236, a pair of thin partitions 246 formed parallel to the direction in which bottom opening 244 extends and a prescribed height from metal plate 236 are present together with a number of thin partitions 248 formed parallel to thin partitions 246 and at the same height as thin partitions 246. Thin partitions 246 and 248 both extend along the bottom openings of a plurality of small apertures 238. The pair of thin partitions 246 are equal in height with each other. Although the height of thin partition 248 is also identical to the height of thin partition 246 in this embodiment, the height of thin partitions 248 may be selected to be equal to or less than the height of thin partition 246. Further, thin partitions 248 are not necessarily required.

In the case of the metal mask 111 of the screen printing plate in accordance with the twelfth embodiment, a straight line having clear edges as follows can be printed. Ink pressed into apertures 238 by a squeegee which is not shown reaches the surface of a material to be printed through bottom opening 244. The ink would be liable to spread over the surface of the material to be printed, but is restrained from spreading by the existence of thin partitions 246. The ink does not therefore spread further beyond the outer edges of thin partitions 246. There on the bottom surfaces of bridges 240 is provided no partitions for parting spaces under apertures 238. The ink which has reached the surface of the material to be printed separately through respective bottom openings 244 of adjacent apertures 238 comes together under bridges 240. As a result, a straight line is printed by apertures 238. At that time, the degree of the spreading of the ink at the edges of the line to be printed is restricted by the outer edge surfaces of thin partitions 246 on both sides as described above. The degree of the spreading of the ink at the edges of the line to be printed is substantially identical at any points of the edges of the line, and a sharp and clear line with extremely little unevenness at the edges can be printed.

In the above description, there is not any partition under bridges 240. However, one partition similar to thin partition 246 may be provided under bridges 240. In this case, because the ink comes into the space between the bottom surface of the partition and the surface of the material to be printed, the ink having reached the surface of the material to be printed through adjacent apertures 248 comes together under bridges 240 as in the case of foregoing.

FIGS. 46A–46F are enlarged cross sectional views showing a part of the metal mask 111 of the screen printing plate taken along ILVI—ILVI in FIG. 45, for use in illustration of a process of manufacturing the metal mask 111 of the screen printing plate in accordance with the twelfth embodiment.

Figure 46A:
FIGS. 46A–46F are enlarged cross sectional views showing a part of a metal mask and other structure, for use in illustration of a manufacturing process of the screen printing plate in accordance with the twelfth embodiment.

Referring to FIG. 46A, a conductive film 250 of a conductive material, for example silver, copper or the like is formed on the surface of glass plate 20. Conductive film 250 is for providing the surface of a plate to be treated with conductivity in a course of Ni plating which will be later described. Therefore, a stainless plate or a metal plate may be used as a supporting body instead of forming conductive film 250 on glass plate 20.

Figure 46B:
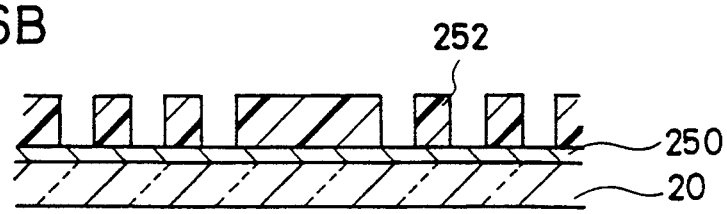

Now, referring to FIG. 46B, on the surface of conductive film 250 is formed a resist film 252 having a female portion for receiving a male portion on the bottom surface of a screen printing plate to be formed. The formation of resist film 252 is conducted by a conventional process. A further detailed description will not therefore be repeated here.

Figure 46C:
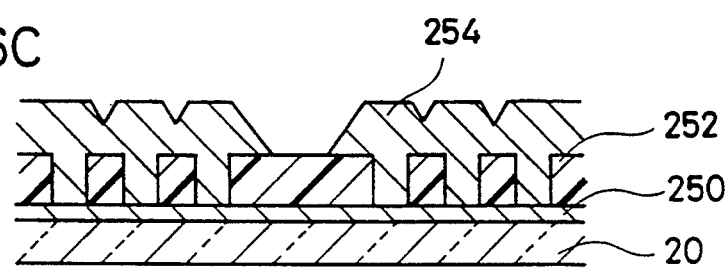

Referring to FIG. 46C, a metal layer, for example, an Ni layer 254 is formed on conductive film 250 by means of plating. Because Ni layer 254 will not be formed on resist layer 252, an opening where there is no layer 254 is formed on resist layer 252 if the area of resist layer 252 is large. If the area of resist Ni layer 252 is small, the Ni layer formed on the both sides of the resist layer are joined on the resist layer to form a plate-like structure. Previously selecting appropriate thickness, resist width, pitch of the resist, and appropriate thickness of Ni layer to be formed by plating makes it possible to control the size of opening to be formed in Ni layer 254. This opening defines a bottom opening 244 in the lower portion of very small aperture 238 shown in FIG. 45.

Figure 46D:
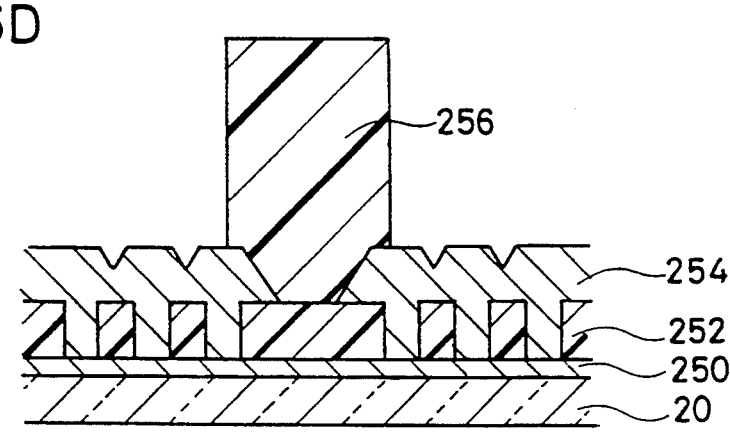

Then, referring to FIG. 46D, a resist layer 256 having a form in correspondence with a plan view of very small aperture 238 (see FIG. 45) is formed to a prescribed thickness on the surface of Ni layer 254. The formation of resist layer 256 is conducted by a conventional process and, therefore, detailed description thereof is not repeated here.

Figure 46E:
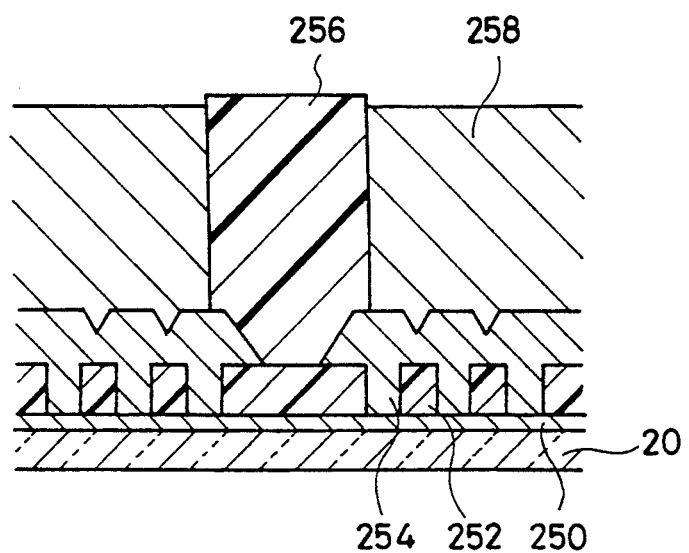

Referring to FIG. 46E, Ni plating is conducted to form an Ni layer 258 on Ni layer 254. In this case, for better contacting of Ni layers 254 and 258, it will be necessary to remove an oxide film on the surface of Ni layer 254 previously using perchloric acid or the like. The thickness of Ni layer 258 is so selected that the surface of Ni layer 258 is lower than the top surface of resist layer 256. Ni layer 258 grows integrally in the part where there is no resist film 256. Therefore, the larger the thickness of Ni layer 258 is set to be, the larger the metal mask thickness becomes, and the strength thereof is increased as well.

Figure 46F:
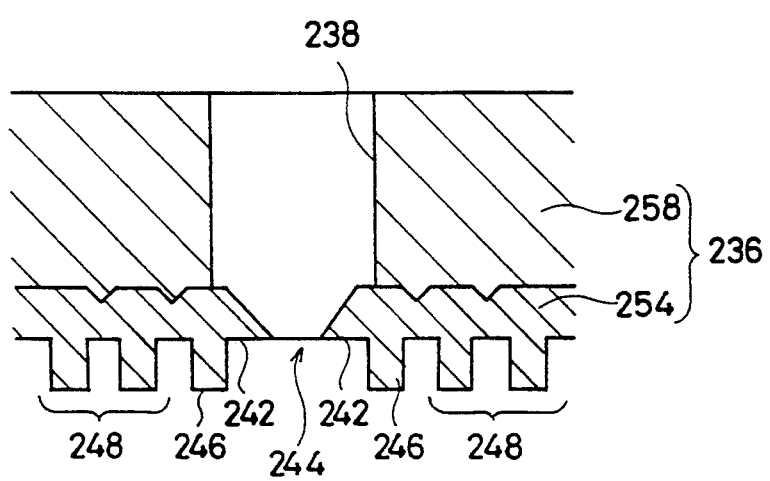

Referring to FIG. 46F, the part above conductive film 250 is separated from glass plate 20. Removal of conductive film 250, resist layers 252 and 256 from metal plate 236 formed of Ni layers 254 and 258 by dissolving provides a desired screen printing plate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A printing plate for screen printing to form a prescribed pattern on an object with a liquid for pattern formation, comprising:
   a plate of a prescribed material having a first surface and a second surface and divided into a first part and a second part, said first part having small apertures allowing the liquid for pattern formation to be pressed out from said first surface to said second surface formed therein, said second part not allowing the liquid for pattern formation to be transferred from said first surface to said second surface; and
   limiting means formed along a boundary of said first part and said second part on said second surface, said limiting means being formed in said second part of said plate and protruding by a prescribed uniform height from said second surface, for limiting within the second part the spreading on said object of the liquid for pattern formation pressed out through said small apertures to said second surface,
   said limiting means having a first edge facing said first part and a second edge facing away from said first part, and there being a distance between said first edge and said second edge such that said liquid is uniformly introduced from said first edge to said second edge, and said limiting means on the side of said second edge protruding from said second part having the prescribed uniform height and a steepness such that said liquid does not spread from said first edge beyond said second edge into said second part;
   cross sectional area limiting means provided in each of said small apertures for reducing the cross sectional area of each of said small apertures at a predetermined portion thereof so that said cross sectional area is smaller only at said predetermined portion so as to create other portions larger than said predetermined portion of each of said small apertures such that said liquid for pattern formation is supplied through said apertures by an amount appropriate for forming sharp pattern edges;
   said small apertures being defined by sidewalls, and said cross sectional area limiting means including a pair of protruding members protruding inward from said sidewalls of said small aperture for such a distance that a prescribed opening smaller than the cross sectional area of said predetermined portions of said small aperture is left between said pair of protruding members.

2. A printing plate as recited in claim 1, wherein said plate is formed of a prescribed metal material.

3. A printing plate as recited in claim 2, wherein said limiting means includes a protruding member.

4. A printing plate as recited in claim 3, wherein said protruding member surrounds said first part.

5. A printing plate as recited in claim 4, further comprising a reinforcement member formed protruding by a height less than or equal to the height of said protruding member in said second part of said second surface for increasing the strength of said plate.

6. A printing plate as recited in claim 4, further comprising a partition member protruding by a height less than or equal to the height of said protruding member in said second surface between adjacent ones of said small apertures.

7. A printing plate as recited in claim 3, wherein said protruding member surrounds said second part.

8. A printing plate as recited in claim 3, wherein said protruding member is formed of the same metal as said metal material constituting said plate.

9. A printing plate as recited in claim 8, wherein said protruding member is an integral part of said plate.

10. A printing plate as recited in claim 3, wherein said protruding member is formed of a material different from said plate.

11. A printing plate as recited in claim 1, wherein said uniform height is substantially greater than said distance between said first and second edges.

12. A printing plate as recited in claim 1, wherein said plate and said pair of protruding members are formed of a common prescribed metal material.

13. A printing plate as recited in claim 12, wherein said limiting means includes a protruding member.

14. A printing plate as recited in claim 13, wherein said protruding member surrounds said second part.

15. A printing plate as recited in claim 13, wherein said protruding member surrounds said first part.

16. A printing plate as recited in claim 13, wherein said protruding member is formed of said metal material the same as said plate.

17. A printing plate as recited in claim 16, wherein said protruding member is an integral part of said plate.

* * * * *